United States Patent
Bash et al.

(10) Patent No.: US 7,057,506 B2
(45) Date of Patent: Jun. 6, 2006

(54) COOLING FLUID PROVISIONING WITH LOCATION AWARE SENSORS

(75) Inventors: Cullen E. Bash, San Francisco, CA (US); Salil Pradhan, Santa Clara, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 216 days.

(21) Appl. No.: 10/758,229

(22) Filed: Jan. 16, 2004

(65) Prior Publication Data

US 2005/0155646 A1 Jul. 21, 2005

(51) Int. Cl.
G08B 25/00 (2006.01)

(52) U.S. Cl. ............ 340/524; 340/501; 340/506; 340/584

(58) Field of Classification Search ......... 340/584, 340/585, 588, 589, 501, 506, 524; 236/13, 236/12.12, 46 R; 62/198, 199, 225, 229
See application file for complete search history.

(56) References Cited

U.S. PATENT DOCUMENTS

| | | | |
|---|---|---|---|
| 4,058,253 A * | 11/1977 | Munk et al. ............ 236/46 R |
| 5,372,544 A | 12/1994 | Gervais ............... 454/256 |
| 5,718,628 A | 2/1998 | Nakazato et al. ......... 454/184 |
| 6,019,677 A | 2/2000 | Demster ............... 454/290 |
| 6,250,560 B1 | 6/2001 | Kline et al. ........... 236/49.3 |
| 6,286,764 B1 * | 9/2001 | Garvey et al. ......... 236/12.12 |
| 6,296,193 B1 * | 10/2001 | West et al. ............ 236/13 |
| 6,786,056 B1 * | 9/2004 | Bash et al. ............ 62/199 |
| 6,938,433 B1 * | 9/2005 | Bash et al. ............ 62/229 |

* cited by examiner

*Primary Examiner*—Van T. Trieu
(74) *Attorney, Agent, or Firm*—Richard P. Lange

(57) ABSTRACT

A method of controlling cooling fluid provisioning in a room housing a plurality of components. The room includes at least one plenum having one or more cooling system components configured to vary a characteristic of at least one of cooling fluid supply to and removal from the room. In the method, location aware sensors are positioned at various locations in the room and their locations are determined. One or more conditions are detected with the location aware sensors and it is determined whether to manipulate at least one of the one or more cooling system components to modify a characteristic of cooling fluid contained in the plenum based upon the detected one or more conditions. In addition, at least one of the one or more cooling system components is manipulated in response to a determination to that the at least of the one or more cooling system components is to be modified.

42 Claims, 9 Drawing Sheets

COOLING FLUID PROVISIONING WITH LOCATION AWARE SENSORS

BACKGROUND OF THE INVENTION

A data center may be defined as a location, for instance, a room, that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate up to eighty (80) systems. The computer systems typically include a number of printed circuit boards (PCBs), mass storage devices, power supplies, processors, micro-controllers, and semi-conductor devices, that dissipate relatively significant amounts of heat during their operation. For example, a typical computer system comprising multiple microprocessors dissipates approximately 250 W of power. Thus, a rack containing forty (40) computer systems of this type dissipates approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling air across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more air conditioning units. For example, compressors of air conditioning units typically consume a minimum of about thirty (30) percent of the required operating energy to sufficiently cool the data centers. The other components, for example, condensers and air movers (fans), typically consume an additional twenty (20) percent of the required total operating energy. As an example, a high density data center with 100 racks, each rack having a maximum power dissipation of 10 KW, generally requires 1 MW of cooling capacity. Air conditioning units with a capacity of 1 MW of heat removal generally requires a minimum of 300 KW input compressor power in addition to the power needed to drive the air moving devices, for instance, fans and blowers. Conventional data center air conditioning units do not vary their cooling fluid output based on the distributed needs of the data center. Instead, these air conditioning units generally operate at or near a maximum compressor power even when the heat load is reduced inside the data center.

In addition, the substantially static operation of conventional vents within data centers are generally designed to operate efficiently within a relatively narrow range of heat loads. However, if electronic components are allowed to exceed rated temperatures, data corruption or damage may result. Thus, conventional cooling systems and vent configurations typically operate under worst-case scenarios. For at least these reasons, cooling air is supplied to the components at around 100 percent of the estimated cooling requirement. In this respect, conventional cooling systems often attempt to cool components that may not be operating at levels which may cause their temperatures to exceed a predetermined temperature range. Consequently, conventional data centers often incur greater startup costs for cooling systems sufficiently large to meet these cooling requirements as well as greater amounts of operating expenses than may be necessary to sufficiently cool the heat generating components contained in the data centers.

Moreover, conventional vents within data centers are typically not automatically adjustable. Rather, conventional vents in data centers are usually provided as simple open grates for always full-open operation. Occasionally, data center vents are provided as manually adjustable between full open and full closed positions. Unfortunately, however, manually adjustable vents are not very useful in quickly and efficiently adapting to the ever-changing thermodynamics within a data center. Use of conventional vents within a data center also tends to give rise to negative air flow conditions or scavenging of air from a conditioned space through one or more of the vents. In other words, there are situations in which a cooling system actually pulls, instead of pushes, air back through a vent into the plenum and out a different vent. Scavenging typically occurs at the expense of a vent that is relatively distant from the cooling system blower for the benefit of a vent located relatively proximate the blower. Such a condition is undesirable since it is typically desired to maintain neutral to positive air flow at each vent within a data center. One attempt to solve the scavenging problem is to simply increase the output of the blower. This may or may not cure the scavenging condition and definitely increases the cost of operating the cooling system and data center.

Some data center vents are designed to maintain a continuous flow rate of air therethrough. For example, some vents include fans and other mechanisms for attempting to maintain a continuous flow rate of air. Such vent devices are operated based on input from sensor readings taken in the space to be conditioned. Unfortunately, however, such devices, in and of themselves, cannot solve the scavenging problem described above. The problem remains that underfloor plenum pressure intolerably fluctuates and is unpredictable. Accordingly, such non-uniform plenum pressure typically leads to scavenging and a lack of neutral to positive airflow to racks within a data center.

SUMMARY OF THE INVENTION

According to an embodiment, the present invention pertains to a method of controlling cooling fluid provisioning in a room housing a plurality of components. The room includes at least one plenum having one or more cooling system components configured to vary a characteristic of at least one of cooling fluid supply to and removal from the room. In the method, location aware sensors are positioned at various locations in the room and their locations are determined. One or more conditions are detected with the location aware sensors and it is determined whether to manipulate at least one of the one or more cooling system components to modify a characteristic of cooling fluid contained in the plenum based upon the detected one or more conditions. In addition, at least one of the one or more cooling system components is manipulated in response to a determination to that the at least of the one or more cooling system components is to be modified.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
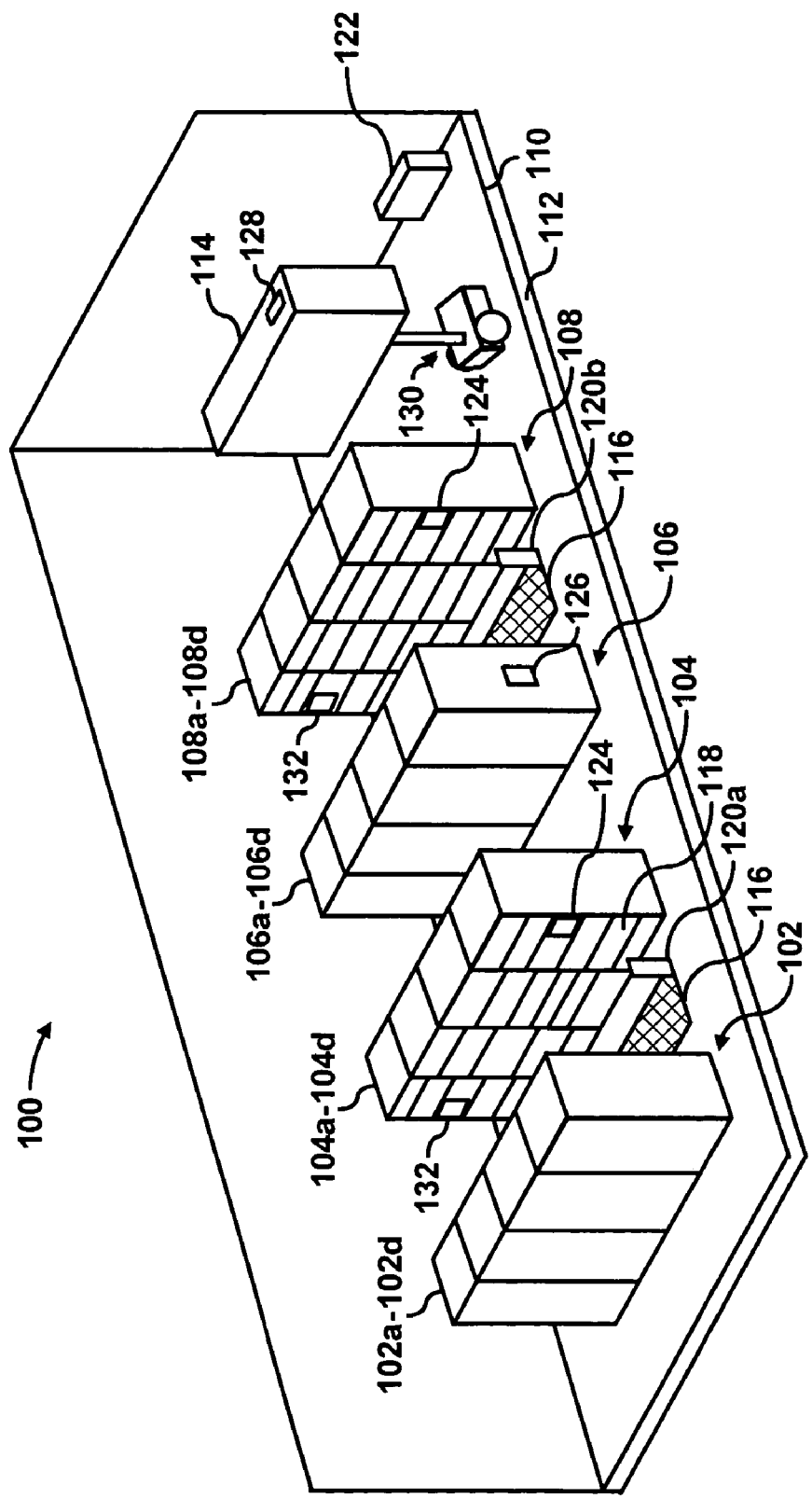
FIG. 1A is a simplified perspective view of a room, for instance, a data center, according to an embodiment of the invention.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Throughout the present disclosure, reference is made to "cooling fluid" and "heated cooling fluid". For purposes of simplicity, "cooling fluid" may generally be defined as air that has been cooled by a cooling device, for instance, an air conditioning unit. In addition, "heated cooling fluid" may generally be defined as cooling fluid that has been heated. It should be readily apparent, however, that the terms "cooling fluid" are not intended to denote air that only contains cooled fluid and that "heated cooling fluid" only contains cooling fluid that has been heated. Instead, embodiments of the invention may operate with air that contains a mixture of heated cooling fluid and cooling fluid. In addition, cooling fluid and heated cooling fluid may denote gases other than air, e.g., refrigerant and other types of gases known to those of ordinary skill in the art that may be used to cool electronic components.

Location aware sensors ("LAS") capable of being auto-configured are employed for at least one of local and zonal control of cooling fluid delivery to various areas of a room, for instance, a data center. The term "auto-configured" generally refers to the ability of the LAS's to determine their locations with respect to other devices and/or other reference points. LAS's are described in greater detail hereinbelow along with examples of suitable devices. Through use of the LAS's, the costs associated with their deployment may be relatively lower as compared with the use of conventional sensors. The costs may be relatively lower, for instance, because the costs associated with deploying the LAS's as well as the amount of labor required to manually track the LAS locations may be substantially reduced over known methods of sensor deployment and implementation.

The LAS's also include one or more sensors configured to detect one or more environmental conditions. The one or more environmental conditions may include pressure, temperature, humidity, moisture presence, airflow velocity, airflow direction, etc. The LAS's may also include sensors configured to detect positions of various cooling system components. The cooling system components may include vent tiles, barriers, etc. The LAS's may also include components to enable communications between the LAS's and other systems. Thus, in one respect, data collected by the sensors of respective LAS's may be communicated to other LAS's or systems. The systems may include, for instance, a computer system and/or a robotic device configured to control operations of a cooling system configured to supply the room with cooling fluid. In addition, or alternatively, the systems may include one or more agents configured to control various cooling system components. The agents may be defined as elements or entities that perceive their environment through sensors, in this case, through the sensors of the LAS's, and act upon that environment through effectors either in a collaborative or autonomous manner to achieve pre-defined goals. The computer system and the agents may also operate in collaborative or autonomous manners with respect to each other. In addition, the computer system may also be defined as an agent.

For those devices that are not in direct communication with the computer system, for instance, devices that are relatively distant from the computer system, the collected data may be relayed through one or more other LAS's to generally enable the collected data to be delivered to the computer system. In other words, the data may be delivered to the computer system through "multi-hopping" of the data through one or more of the LAS's.

The LAS's may be positioned at various locations in the room and generally form a network of LAS's configured to detect the one or more conditions, for instance, environmental and/or positional, at the various locations. The positions of the LAS's may be associated with other components in the room, for instance, vent tiles, plenums, dividers, and the like. In one respect, the locations of the components may also be determined through the auto-configuring aspects of the LAS's. In another respect, the data collected by the LAS's may be implemented to control one or more of cooling fluid delivery into the various locations of the room and heated cooling fluid removal from the various locations of the room.

For instance, through knowledge of the locations of various cooling system components in the room, e.g., vent tiles, return tiles, plenums, dividers, and the like, the various cooling system components may be controlled to vary cooling fluid delivery and/or heated cooling fluid removal substantially based upon the conditions detected by the wireless devices. As a more specific example, the LAS's may be positioned near or on vent tiles or otherwise associated with the vent tiles, which may be configured to controllably supply various sections of the room with cooling fluid. The LAS's may be configured to detect, for instance, the temperature or pressure of the air in the respective vicinities of the LAS's. The vicinities of the LAS's may be defined as, for instance, areas around respective racks, respective rows, a number of respective racks or rows, and the like. The LAS's may also be configured to detect the direction and magnitude of airflow through the vent tiles, for instance, with anemometers and the like.

The data collected by the LAS's may be transmitted to one or more associated agents configured to process the data and make control decisions. Examples of agents and their operabilities are described in greater detail hereinbelow. The agents may make determinations on how to control, for instance, associated vent tiles based upon the data received from the LAS's. For instance, the agents may have predetermined goals or objectives, e.g., predetermined temperature ranges, predetermined energy usages, etc., and are configured to request cooling resources to achieve those goals. The agents may request for cooling resource changes to a computer system, for instance, an energy manager, or the agents may request for cooling system changes to a robotic device.

With reference first to FIG. 1A, there is shown a simplified perspective view of a room 100, e.g., a data center, according to an embodiment of the invention. The terms "data center" are generally meant to denote a room or other space and are not meant to limit the invention to any specific type of room where data is communicated or processed, nor should it be construed that use of the terms "data center" limits the invention in any respect other than its definition hereinabove.

The room 100 depicted in FIG. 1A represents a generalized illustration and other components may be added or existing components may be removed or modified without departing from the scope of the invention. For example, the room 100 may include any number of racks and various other apparatuses known to be housed in data centers. Thus, although the room 100 is illustrated as containing four rows of racks 102–108, it should be understood that the room 100 may include any number of racks, e.g., 100 racks, without departing from the scope of the invention. The depiction of four rows of racks 102–108 is thus for illustrative and simplicity of description purposes only and is not intended to limit the invention in any respect.

The room 100 is depicted as having a plurality of racks 102–108, e.g., electronics cabinets, aligned in substantially parallel rows. The racks 102–108 are illustrated as having open front sides such that the components 118 housed therein are visible. It should, however, be understood that embodiments of the invention may be practiced with racks having panels that cover the front sides of the racks 102–108 without departing from the scope of the invention. The rows of racks 102–108 are shown as containing four racks (a–d) positioned on a raised floor 110. A plurality of wires and communication lines (not shown) may be located in a space 112 beneath the raised floor 110. The space 112 may also function as a plenum for delivery of cooling fluid from a computer room air conditioning unit (CRAC) 114 to the racks 102–108. The cooling fluid may be delivered from the space 112 to the racks 102–108 through vent tiles 116 located between some or all of the racks 102–108. The vent tiles 116 are shown in FIG. 1A as being located between racks 102 and 104 and 106 and 108.

The racks 102–108 are generally configured to house a plurality of components 118, for instance, computers, servers, monitors, hard drives, disk drives, etc., designed to perform various operations, for instance, computing, switching, routing, displaying, etc. These components 118 may comprise subsystems (not shown), for example, processors, micro-controllers, high-speed video cards, memories, semiconductor devices, and the like to perform these functions. In the performance of these electronic functions, the components 118, and therefore the subsystems, generally dissipate relatively large amounts of heat. Because the racks 102–108 have generally been known to include upwards of forty (40) or more subsystems, they may transfer substantially large amounts of heat to the cooling fluid to maintain the subsystems and the components 118 generally within predetermined operating temperature ranges.

A relatively small number of components 118 are illustrated as being housed in the racks 102–108 for purposes of simplicity. It should, however, be understood that the racks 102–108 may include any number of components 118, e.g., forty or more components 118, without departing from the scope of the invention. In addition, although the racks 102–108 are illustrated as containing components 118 throughout the heights of the racks 102–108, it should be understood that some or all of the racks 102–108 may include slots or areas that do not include components 118 without departing from the scope of the invention.

A plurality of LAS's 120a, 120b are positioned at various locations of the room 100. The LAS's 120a, 120b generally comprise devices configured to determine their locations with respect to either other LAS's 120a, 120b or to some other reference location. The LAS's 120a, 120b may comprise the LAS's disclosed in co-pending and commonly assigned U.S. patent application Ser. No. 10/620,272, filed on Jul. 9, 2003, the disclosure of which is hereby incorporated by reference in its entirety. As disclosed in that application, the LAS's are designed to communicate with one another in a manner to enable wireless data transfer therebetween. These sensors are termed "location aware" because they are operable to determine their general locations with respect to other sensors and/or devices.

In one regard, through use of the LAS's 120a, 120b, as the LAS's 120a, 120b are arranged in the room 100, their locations may be determined while requiring little or no user intervention. In addition, as the layout of the room 100 changes or if the LAS's 120a, 120b are moved or replaced, their locations may also be determined with little or no user intervention.

The LAS's 120a, 120b also include one or more sensors (not shown) configured to detect a variety of conditions. For instance, the one or more sensors may be configured to detect environmental conditions, such as, temperature, pressure, humidity, moisture presence, airflow velocity, airflow direction, etc. The sensors may also be configured to detect positions of various cooling system components, such as, vent tiles, plenum barriers, etc. As with the LAS's of the Ser. No. 10/620,272 application, the LAS's 120a, 120b may also include components (not shown) to enable communications between the LAS's 120a, 120b and/or another reference location. Thus, in one respect, data or information collected by the sensors of respective LAS's 120a, 120b may be communicated to other LAS's 120a, 120b and/or to other devices, such as, computer systems configured to control operations of various systems in the room 100.

The LAS's 120a, 120b are illustrated as being positioned adjacent the vent tiles 116. The depiction of the LAS's 120a, 120b is for illustrative and simplicity of description purposes and is not intended to limit the scope of the invention. Instead, the LAS's 120a, 120b may be positioned at various other locations in the room 100 without departing from the scope of the invention. For instance, the LAS's 120a, 120b may be positioned in the space 112, integrally formed in the vent tiles 116, etc.

The vent tiles 116 may comprise a plurality of separate vent tiles each configured to supply one or more of the various racks 102–108 with cooling fluid. In addition, the LAS's 120a, 120b may be associated with one or more respective vent tiles 116 or various locations in the room 100. The association of the LAS's 120a, 120b with the one or more respective vent tiles 116 may be performed prior to, during, or after installation of either or both of the vent tiles 116 and the LAS's 120a, 120b. Through knowledge of the locations of the LAS's 120a, 120b and the vent tiles 116 to which they are respectively associated, the locations of the vent tiles 116 may also be determined. In addition, as vent tiles 116 and/or LAS's 120a, 120b are added, removed or replaced in the room 100, the locations of the vent tiles 116 may be tracked while requiring little or no user intervention.

The vent tiles 116 may comprise the dynamically controllable vents disclosed and described in U.S. Pat. No. 6,574,104. As described in that application, the vent tiles 116 are termed "dynamically controllable" because they generally operate to control at least one of velocity, volume flow rate and direction of the cooling fluid therethrough. In addition, specific examples of dynamically controllable vents 116 may be found in co-pending U.S. application Ser. No. 10/375,003, filed on Feb. 28, 2003, which is assigned to the assignee of the present invention and is incorporated by reference herein in its entirety.

As described in greater detail in the co-pending applications cited above, the vent tiles 116 may operate to vary cooling fluid flow characteristics therethrough by varying the angles of one or more vanes contained in the vent tiles 116. The vent tiles 116 may include one or more actuators (not shown) configured to be controlled by any of a number of various systems. For instance, the one or more actuators may be controlled by a computer system e.g., an energy manager, designed to control various cooling system components, e.g., vent tiles 116, CRAC units 114, etc. As another example, the LAS's 120a, 120b may control the one or more actuators. Additional systems capable of controlling the one or more actuators will be described below.

The LAS's 120a, 120b may include sensors configured to detect the positions of the vanes. The sensors may include, for instance, encoders or other position detection devices. The LAS's 120a, 120b may also include one or more sensors configured detect one or more environmental conditions, such as, pressure, humidity, temperature, airflow velocity, airflow direction, etc. In this regard, the one or more sensors may comprise thermometers, thermocouples, barometers, anemometers, or other detecting devices.

The LAS's 120a, 120b may also be in communication with one or more systems configured to process and/or control the vent tiles 116 or other cooling system components. For instance, the LAS's 120a, 120b may be in communication with a computer system 122 designed to control operations of the vent tiles 116. Manners in which the LAS's 120a, 120b may be operated as well as the computer system 122 are described in greater detail in the Ser. No. 10/620,272 application. For instance, the computer system 122 may store information pertaining to the identities and locations of the LAS's 120a, 120b and the vent tiles 116 to which they are associated. In addition, the computer system 122 may receive detected information from the LAS's 120a, 120b and may control one or more cooling system components, for instance, vent tiles 116, CRAC 114, etc., in response to information received from the LAS's 120a, 120b. A more detailed description the various manners in which the LAS's 120a, 120b may communicate with the computer system 122 as well as the functionalities of the computer system 122 are omitted for purposes of brevity. Instead, the description provided in the Ser. No. 10/620,272 application is relied upon to provide adequate disclosure of these aspects.

In another example, the LAS's 120a, 120b may be in wireless communication with one or more associated agents 124–128. The wireless communications between the LAS's 120a, 120b and their associated agents 124–128 may be enabled through any reasonably suitable known means. The agents 124–128 depicted in FIG. 1A are for illustrative purposes only and are not meant to limit the invention in any respect. Instead, the agents 124–128 may be positioned at any reasonably suitable location around the room 100. The agents 124–128 may comprise algorithms or software stored in one or more locations of the room 100 and may thus not comprise separate physical structures as illustrated in FIG. 1A. For instance, the agents 124–128 may be stored in the memories of various components 118 housed in the racks 102–108 and distributed throughout the room 100. In addition or alternatively, the agents 124–128 may be stored and executed by the computer system 122.

The agents 124–128 may operate as substantially autonomous devices designed to realize various goals or to perform various tasks. These goals may comprise maintaining environmental conditions within their respective areas within predefined ranges, operating cooling system components at predefined energy efficiency levels, etc. In trying to obtain these goals, the agents 124–128 may be designed to communicate with a robotic device 130 or the computer system 122 for assistance. The robotic device 130 or the computer system 122 may have its own goals or objectives and may determine how to achieve the agents' 124–128 goals while maintaining its own goals or objectives. An embodiment of the agents 124–128 is described in commonly assigned and co-pending U.S. patent application Ser. No. 10/345,723, filed on Jan. 16, 2003, entitled "AGENT BASED CONTROL METHOD AND SYSTEM FOR ENERGY MANAGEMENT", the disclosure of which is hereby incorporated by reference in its entirety. In addition, an embodiment of manners in which the agents 124–128 may be operated with respect to a robotic device is described in commonly assigned and co-pending U.S. patent application Ser. No. 10/697,692, filed on Oct. 31, 2003, entitled "AGENT-BASED OPERATION OF A ROBOTIC DEVICE", the disclosure of which is hereby incorporated by reference in its entirety.

In operation, the agents 124–128 may receive data or information from their associated LAS's 120a, 120b. In terms of associating the agents 124–128 with certain ones of the LAS's 120a, 120b, the association may be based, for instance, on the relative locations of the LAS's 120a, 120b and the agents 124–128. By way of example, the agents 124 and 126 of particular rows of racks 102–108 may be associated with one or more of the LAS's 120a, 120b located in the same rows. As another example, each of the racks 102–108 may comprise an agent 124 associated with LAS's 120*a*, 120*b* associated with vent tiles 116 configured to supply the respective racks 102–108 with cooling fluid. As a further example, one or more agents 128 may be associated with one or more LAS's 120*a*, 120*b* configured to detect cooling fluid conditions, for instance, temperature, pressure, velocity, etc., in the space 112 where the cooling fluid is supplied from the CRAC 114.

As a further example, one or more of the LAS's 120*a*, 120*b* may comprise tile agents configured to control operations of the vent tiles 116. In this example, the LAS's 120*a*, 120*b* may be configured to both detect one or more conditions around or in the vent tiles 116 and control the vent tiles 116. In addition, the LAS's 120*a*, 120*b* may be attached to or integrally formed with respective vent tiles 116. In one regard, through use of the LAS's 120*a*, 120*b* as tile agents, their reconfiguration will be relatively simple should they be moved.

As a yet further example, the LAS's 120*a*, 120*b* may be in substantially direct wireless communication with the robotic device 130. The robotic device 130 is generally configured to traverse the room 100 and may perform various functions. For instance, the robotic device 130 may be configured to operate in manners as described in commonly assigned and co-pending U.S. patent application Ser. No. 10/446,867, filed on May 29, 2003, the disclosure of which is hereby incorporated by reference in its entirety.

As a yet further example, a relatively secure means for transmitting data detected by the LAS's 120*a*, 120*b* may be employed. In this regard, the room 100 may contain one or more access points 132 configured to communicate with the robotic device 130 when the robotic device 130 is in relatively close proximity to each of the one or more access points 132. The access points 132 may generally comprise gateways for information obtained by the LAS's 120*a*, 120*b* to be compiled and for the compiled information to be conveyed to the robotic device 130.

In this regard, the access points 132 may comprise computers, servers, or other devices capable of performing these functions. In addition, existing servers or computers contained in the racks 102–108 may perform the functions of the access points 132.

Thus, for instance, the LAS's 120*a*, 120*b* may transmit the detected data to associated access points 132. The association between the LAS's 120*a*, 120*b* and the access points 132 may be based upon the locations of the LAS's 120*a*, 120*b* and the access points 132. For instance, the LAS's 120*a*, 120*b* located in a particular row of racks 102–108 may be associated with an access point 132 located in that particular row of racks 102–108. Alternatively, one or more of the access points 132 may be associated with one or more LAS's 120*a*, 120*b* located in a plurality of rows.

The configuration and manners in which the access points 132 and the robotic device 130 may be employed to provide relatively secure means for communicating detected data is described in co-pending and commonly assigned U.S. patent application Ser. No. 10/721,264, filed on Nov. 26, 2003. The disclosure contained in that application is hereby incorporated by reference in its entirety.

Figure 1B:
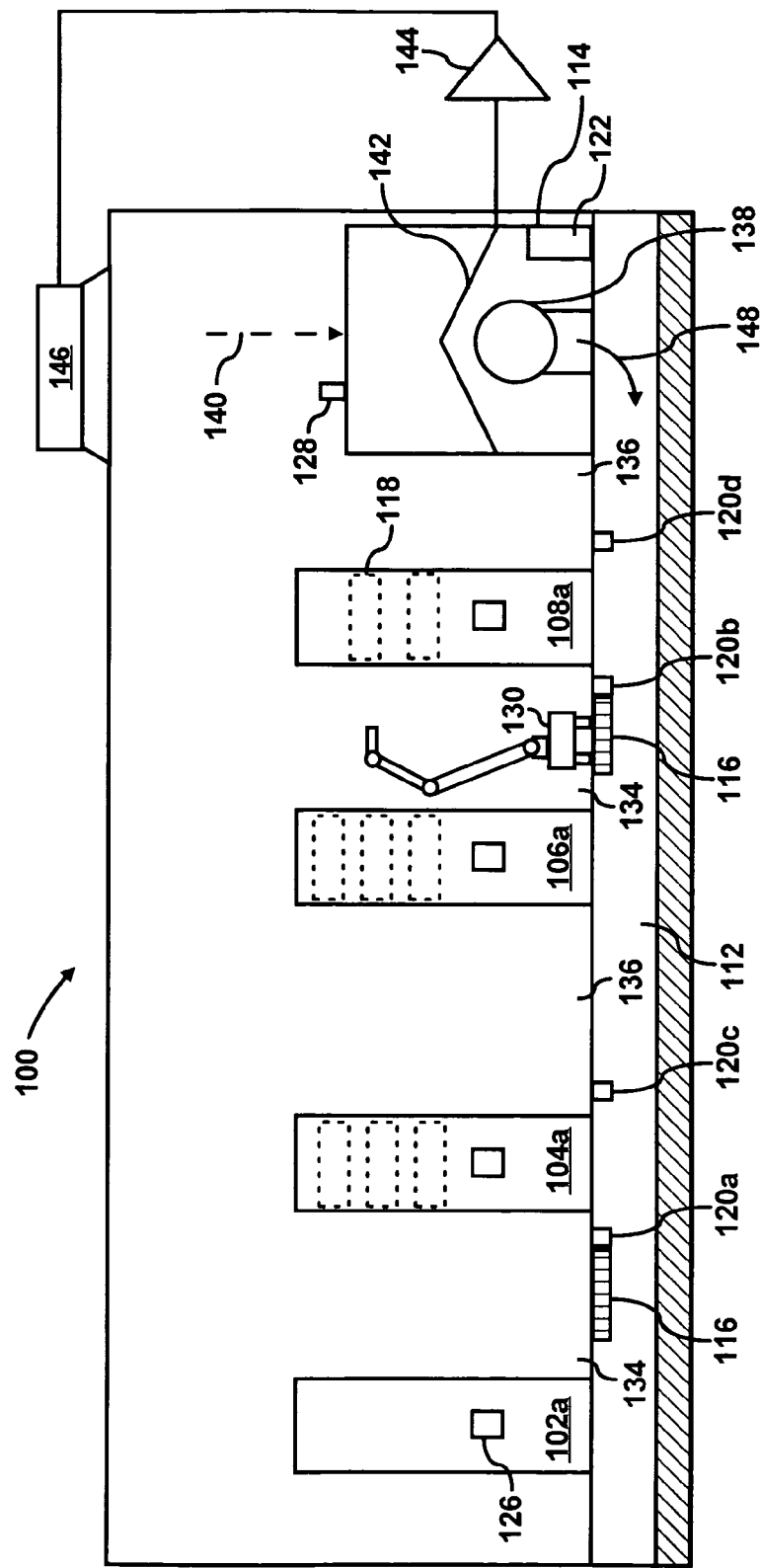
FIG. 1B is a simplified illustration of a side elevational view of the room shown in FIG. 1A, according to an embodiment of the invention.

With reference now to FIG. 1B, there is shown a simplified illustration of a side elevational view of the room 100 shown in FIG. 1A, according to an embodiment of the invention. In FIG. 1B, racks 102*a*, 104*a*, 106*a*, and 108*a* are visible. In addition, some of the components 118 are visible in cross-section through the sides of the racks 102*a*, 104*a*, 106*a*, and 108*a*. A more detailed description of some of the elements illustrated in FIG. 1B may be found in commonly assigned U.S. Pat. No. 6,574,104, filed on Oct. 5, 2001, which is hereby incorporated by reference in its entirety.

As shown in FIG. 1B, the areas between the racks 102 and 104 and between the racks 106 and 108 may comprise cool aisles 134. These aisles are considered "cool aisles" because they are configured to receive cooling fluid from the vent tiles 116. In addition, the racks 102–108 generally receive cooling fluid from the cool aisles 134. The aisles between the racks 104 and 106, and on the rear sides of racks 102 and 108, are considered hot aisles 136. These aisles are considered "hot aisles" because they are positioned to receive cooling fluid heated by the components 118 in the racks 102–108.

As described hereinabove, the CRAC 114 receives and cools heated cooling fluid. In addition, the CRAC 114 supplies the racks 102–108 with chilled or cooled cooling fluid, through, for example, a process as described below. The CRAC 114 generally includes a fan 138 for supplying cooling fluid (e.g., air) into the space 112 (e.g., plenum) and/or drawing air from the room 100. In operation, the heated cooling fluid enters into the CRAC 114 as indicated by the arrow 140 and is cooled by operation of a cooling coil 142, a compressor 144, and a condenser 146, in a manner generally known to those of ordinary skill in the art. In terms of cooling system efficiency, it is generally desirable that the return air is composed of the relatively warmest portion of air in the room 100.

Although reference is made throughout the present disclosure of the use of a fan 138 to draw heated cooling fluid from the room 100, it should be understood that any other reasonably suitable manner of air removal may be implemented without departing from the scope of the invention. By way of example, a fan or a blower (not shown) separate from the fan 138 may be utilized to draw heated cooling fluid from the room 100.

In addition, based upon the cooling fluid needed to cool the heat loads in the racks 102–108, the CRAC 114 may be operated at various levels. For example, the capacity (e.g., the rate of work done by the compressor) of the compressor 144 and/or the speed of the fan 138 may be modified to thereby control the temperature and the amount of cooling fluid flow delivered to the racks 102–108. In this respect, the compressor 144 may comprise a variable capacity compressor and the fan 138 may comprise a variable speed fan. The compressor 144 may thus be controlled to either increase or decrease the mass flow rate of a refrigerant therethrough.

Because the specific type of compressor 144 and fan 138 to be employed with embodiments of the invention may vary according to individual needs, the invention is not limited to any specific type of compressor or fan. Instead, any reasonably suitable type of compressor 144 and fan 138 capable of accomplishing certain aspects of the invention may be employed with embodiments of the invention. The choice of compressor 144 and fan 138 may depend upon a plurality of factors, e.g., cooling requirements, costs, operating expenses, etc.

Embodiments of the invention may be operated with constant speed compressors and/or constant speed fans. In one respect, control of cooling fluid delivery to the racks 102–108 may be based upon the pressure of the cooling fluid in the space 112. According to this embodiment, the pressure within the space 112 may be controlled through operation of, for example, the vent tiles 116 positioned at various locations in the room 100. That is, the pressure within the space 112 may be kept essentially constant throughout the space 112 by selectively controlling the output of cooling fluid through the vent tiles 116. As an example, the space 112 may include a divider as shown and described in the U.S. Pat. No. 6,574,104 to substantially minimize turbulent cooling fluid flow through the space 112.

As another example, if the pressure of the cooling fluid in one location of the space 112 exceeds a predetermined level, a vent tile located substantially near that location may be caused to enable greater cooling fluid flow therethrough to thereby decrease the pressure in that location. A more detailed description of this embodiment may be found in co-pending U.S. application Ser. No. 10/303,761, filed on Nov. 26, 2002 and U.S. application Ser. No. 10/351,427, filed on Jan. 27, 2003, which are assigned to the assignee of the present invention and are hereby incorporated by reference in their entireties.

In addition, or as an alternative to the compressor 144, a heat exchanger (not shown) may be implemented in the CRAC 114 to cool the cooling fluid supply. The heat exchanger may comprise a chilled water heat exchanger, a centrifugal chiller (e.g., a chiller manufactured by YORK), and the like, that generally operates to cool air as it passes over the heat exchanger. The heat exchanger may comprise a plurality of air conditioners. The air conditioners may be supplied with water driven by a pump and cooled by a condenser or a cooling tower. The heat exchanger capacity may be varied based upon heat dissipation demands. Thus, the heat exchanger capacity may be decreased where, for example, it is unnecessary to maintain the cooling fluid at a relatively low temperature.

In operation, cooling fluid generally flows from the fan 138 into the space 112 as indicated by the arrow 148. The cooling fluid flows out of the raised floor 110 and into various areas of the racks 102–108 through the plurality of vent tiles 116. As stated hereinabove, the vent tiles 116 may comprise the dynamically controllable vents disclosed and described in U.S. Pat. No. 6,574,104. As the cooling fluid flows out of the vent tiles 116, the cooling fluid may flow into the racks 102–108. The racks 102–108 generally include inlets (not shown) on their front sides to receive the cooling fluid from the vent tiles 116. The inlets generally comprise one or more openings to enable the cooling fluid to enter the racks 102–108. In addition, or alternatively, the front sides of some or all of the racks 102–108 may comprise devices for substantially controlling the flow of cooling fluid into the racks 102–108. Examples of suitable devices are described in co-pending and commonly assigned U.S. patent application Ser. Nos. 10/425,621 and 10/425,624, both of which were filed on Apr. 30, 2003, the disclosures of which are hereby incorporated by reference in their entireties.

The cooling fluid may become heated by absorbing heat dissipated from the components 118 located in the racks 102–108 as it flows through and around the racks 102–108. The heated cooling fluid may generally exit the racks 102–108 through one or more outlets located on the rear sides of the racks 102–108. In addition, or alternatively, the rear sides of some or all of the racks 102–108 may comprise devices for substantially controlling the flow of cooling fluid into the racks 102–108 and/or controlling the flow of heated cooling fluid out of the racks 102–108. Again, examples of suitable devices are described in co-pending and commonly assigned U.S. patent application Ser. Nos. 10/425,621 and 10/425,624.

The flow of air through the racks 102–108 may substantially be balanced with the flow of air through the vent tiles 116 through operation of the above-described devices in manners consistent with those manners set forth in the above-identified co-pending applications. In addition, a proportional relationship may be enabled between the airflow through the racks 102–108 and the vent tiles 116. Through the cooling fluid flow operations described in those co-pending applications, the level of re-circulation between the heated cooling fluid flow and the cooling fluid may substantially be reduced or eliminated in comparison with known cooling systems.

As an alternative, there may arise situations where the additional cooling fluid flow to the racks 102–108 causes the temperatures of the components to rise. This may occur, for example, when heated cooling fluid is re-circulated into the cooling fluid. In this situation, cooling fluid delivery may be reduced in response to increased component temperatures. In addition, cooling fluid delivery may be increased in response to decreased component temperatures. It should therefore be understood that the present invention is not limited to one operational manner as temperatures in the room 100 vary.

The LAS's 120*a*, 120*b* are depicted in FIG. 1B as being positioned within the space 112. It should, however, be understood that the LAS's 120*a*, 120*b* may be positioned at any reasonably suitable location, for instance, integrally formed with the vent tiles 116, adjacent the vent tiles 116 on the raised floor 110, in the racks 102–108, etc. Additional LAS's 120*c*, 120*d* are also illustrated in FIG. 1B. The additional LAS's 120*c*, 120*d* are configured to detect various conditions in the space 112. For instance, the additional LAS's 120*c*, 120*d* are configured to detect the temperature, humidity, and/or pressure of the cooling fluid supplied by the CRAC 114. The additional LAS's 120*c*, 120*d* may also be configured to detect other conditions in the space 112, such as, moisture detection.

The additional LAS's 120*c*, 120*d* may operate in manners as described hereinabove with respect to the LAS's 120*a*, 120*b*. Thus, for instance, the additional LAS's 120*c*, 120*d* may be operable to determine their locations with respect to each other and the LAS's 120*a*, 120*b* or another reference location. In addition, the additional LAS's 120*c*, 120*d* may be configured to communicate detected conditions with various systems as also described hereinabove with respect to the LAS's 120*a*, 120*b*.

Figure 1C:
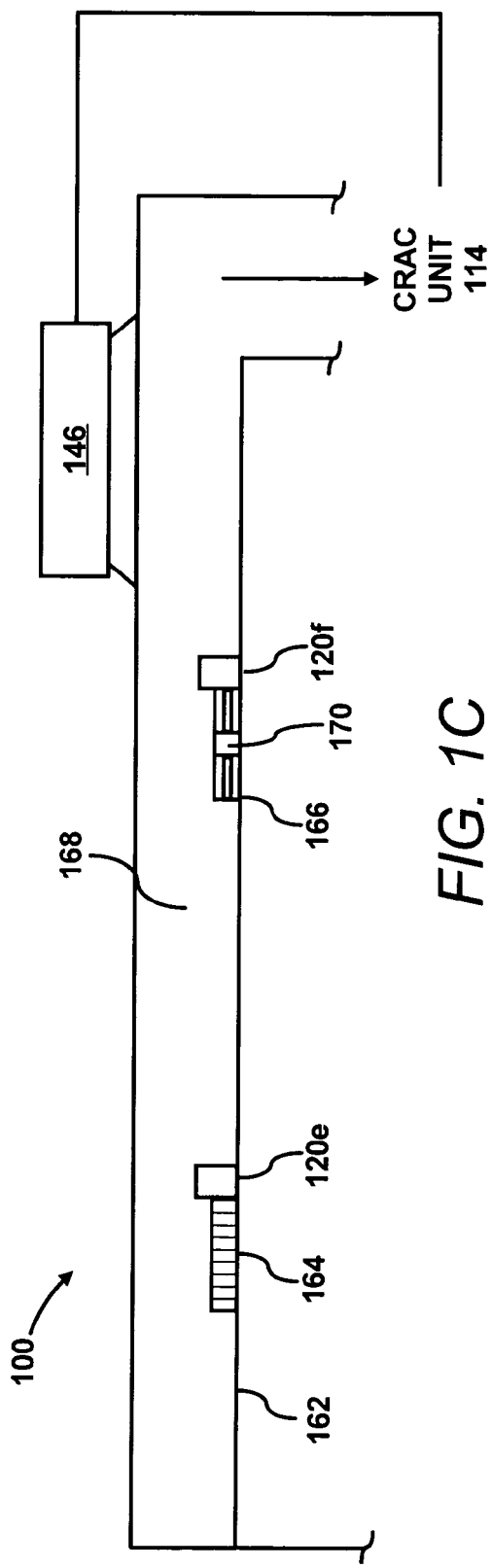
FIG. 1C is a cross-sectional side view of an upper portion of the room shown in FIG. 1A, according to an embodiment of the invention.

FIG. 1C is a cross-sectional side view of an upper portion of the room 100 according to an embodiment of the invention. According to this embodiment, the room 100 includes a lowered ceiling 162. Dynamically controllable returns 164 and 166 are situated along the lowered ceiling 162 to generally enable controlled removal of heated cooling fluid from the room 100. To facilitate removal of heated cooling fluid from the room 100, the returns 164 and 166 may include a fan 170. A more detailed description of the returns 164 and 166 and manners of their operability may be found in co-pending U.S. application Ser. No. 10/262,879, filed on Oct. 3, 2002, which is assigned to the assignee of the present invention and is hereby incorporated by reference in its entirety. As described in the Ser. No. 10/262,879 application, the space 168 between the lowered ceiling 162 and the ceiling of the room 100 may function as a plenum through which heated cooling fluid may be returned to the CRAC 114.

According to an example, LAS's 120*e*, 120*f* may be positioned to detect one or more conditions around the returns 164 and 166. In this regard, the LAS's 120*e*, 120*f* may be located in respective vicinities of the returns 164 and 166 or the LAS's 120*e*, 120*f* may be formed as parts of the returns 164 and 166. The LAS's 120*e*, 120*f* may be designed to detect the flow of air through the returns 164 and 166. This information may be utilized in the operational control of the returns 164 and 166 as described in the Ser. No.

10/262,879 application. In addition, this information may be transmitted to the various systems described hereinabove.

Figure 1D:
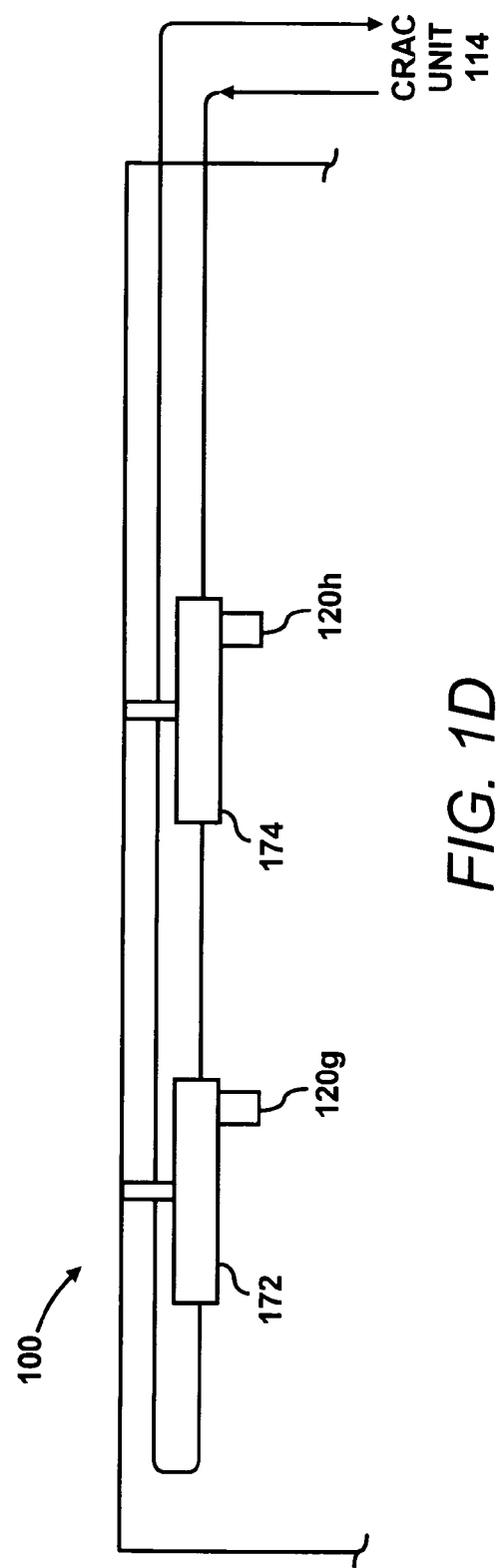
FIG. 1D is a cross-sectional side view of an upper portion of the room shown in FIG. 1A, according to another embodiment of the invention.

FIG. 1D is a cross-sectional side view of an upper portion of the room 100 according to another embodiment of the invention. According to this embodiment, heat exchanger units ("HEU") 172, 174 may be provided in the room 100. The HEU's 172, 174 are disclosed and described in co-pending U.S. application Ser. No. 10/210,040, filed on Aug. 2, 2002, which is assigned to the assignee of the present invention and is hereby incorporated by reference in its entirety. As described in the Ser No. 10/210,040 application, the HEU's 172, 174 generally operate to receive heated cooling fluid from the racks 102–108, cool the received cooling fluid, and deliver the cooled cooling fluid back to the racks 102–108 in a substantially controlled manner.

As also illustrated in FIG. 1D, the HEU's 172, 174 include respective LAS's 120g, 120h.

The LAS's 120g, 120h may be located in the respective vicinities of the HEU's 172, 174 or the LAS's 120g, 120h may be formed as parts of the HEU's 172 and 174. The LAS's 120g, 120h may be designed to detect one or more environmental condition in the vicinities of the HEU's 172, 174. In addition, the LAS's 120g, 120h may be designed to detect the flow of cooling fluid through the HEU's 172, 174. This information may be utilized in the operational control of the HEU's 172, 174 as described in the Ser. No. 10/210,040 application. In addition, this information may be transmitted to the various systems described hereinabove.

Figure 1E:
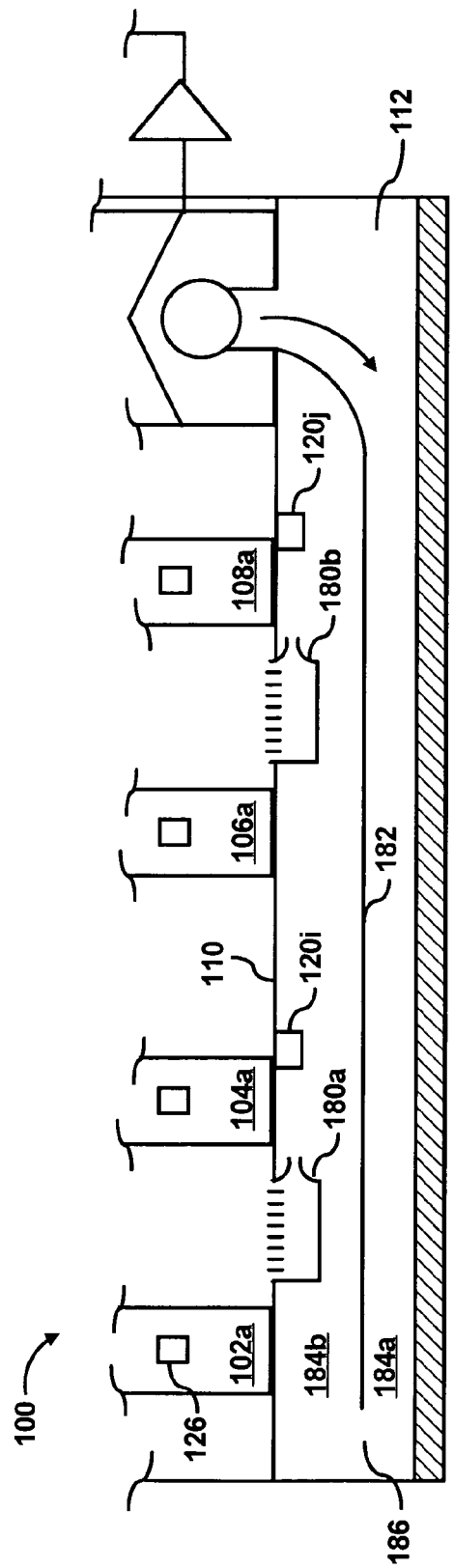
FIG. 1E illustrates a simplified cross-sectional side view of a bottom portion of the room shown in FIG. 1A, according to an embodiment of the invention.

FIG. 1E illustrates a simplified cross-sectional side view of a bottom portion of the room 100 according to an embodiment of the invention. As illustrated in FIG. 1E, the vents 116 comprise variable volume devices (VVD's) 180a and 180b. The VVD's 180a and 180b are described in greater detail in commonly assigned and co-pending U.S. application Ser. No. 10/375,003, filed on Feb. 28, 2003, the disclosure of which is hereby incorporated by reference in its entirety. As described in that patent application, the VVD's 180a and 180b are configured to control the flow resistance within the space 112 and thus modulate the flow of cooling fluid therethrough. Therefore, for instance, the racks 102–108 may receive substantially individualized and localized amounts of cooling fluid according to their heat loads. In addition, characteristics such as, flow resistance, flow velocity and pressure, of the cooling fluid within the space 112 may be controlled by the operation of the VVD's 180a and 180b.

As also illustrated in FIG. 1E, LAS's 120i, 120j are positioned in the space 112. The LAS's 120i, 120j may be located in the respective vicinities of the VVD's 180a, 180b or the LAS's 120i, 120j may be formed as parts of the VVD's 180a, 180b. The LAS's 120i, 120j may be designed to detect one or more environmental conditions in the vicinities of the VVD's 180a, 180b. For instance, the LAS's 120i, 120j may be configured to detect the pressure in respective areas of the space 112. In one example, the detected conditions may be wirelessly transmitted to a controller of the VVD's 180a, 180b which may operate to vary the cooling fluid flow characteristics through the VVD's 180a, 180b. In another example, the detected conditions may be wirelesses transmitted to other LAS's, e.g., LAS's 120a–120j, or to another device configured to control the VVD's 180a, 180b. For instance, the detected conditions may be transmitted to the computer system 122 or the robotic device 130 which may employ the detected condition information in manipulating one or more cooling system components including the VVD's 180a, 180b.

The space 112 is also illustrated as containing a divider 182 configured to generally enable for relatively uniform pressure around the VVD's 180a, 180b. The length of the divider 182 may extend substantially along the entire length of space 112, i.e., in the direction generally perpendicular to the plane of FIG. 1F. The width of the divider 182 may extend from the fan 138 to substantially the end of the space 112 to thus create a gap 184 between a side edge of the divider 182 and a side surface of the space 112. The divider 182 generally divides the space 112 into two relatively separate chambers 184a and 184b. The first chamber 184a is in fluid communication with the outlet of the fan 138. The second chamber 184b is in fluid communication with the first chamber 184a substantially through a gap 186. In this respect, the cooling fluid flow originating from the fan 138 must travel substantially the entire width of the space 112, i.e., through the first chamber 184a, for the fluid flow to enter into the second chamber 184b, thereby reducing the turbulence in the cooling fluid contained in the second chamber 184b.

Figure 1F:
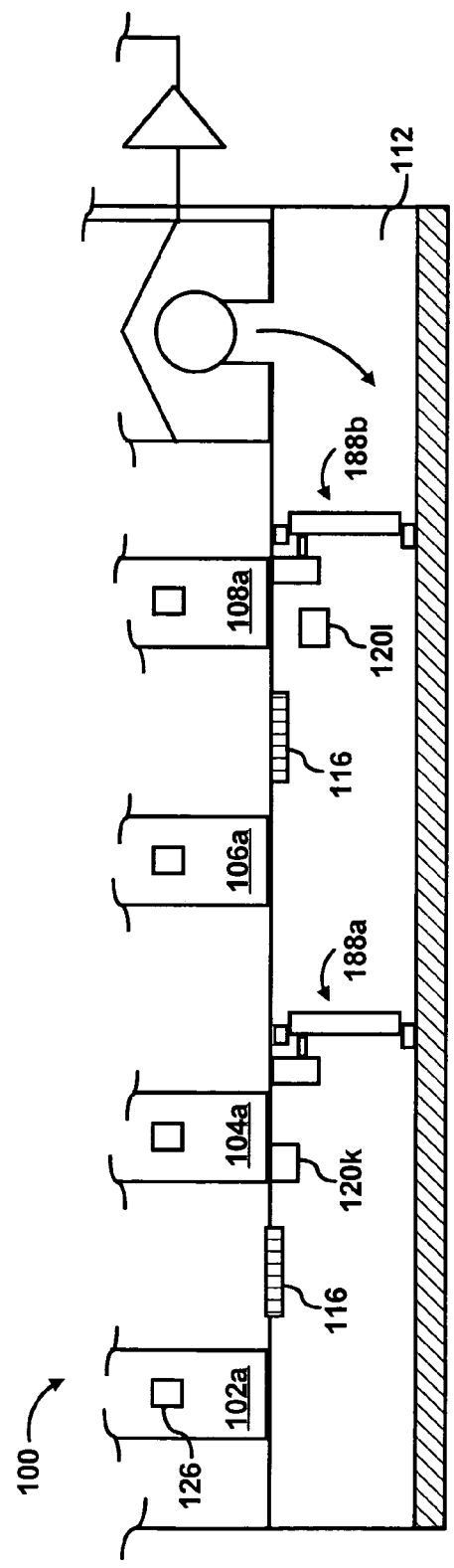
FIG. 1F illustrates a simplified cross-sectional side view of a bottom portion of the room shown in FIG. 1A, according to another embodiment of the invention.

FIG. 1F illustrates a simplified cross-sectional side view of a bottom portion of the room 100 according to another embodiment of the invention. As illustrated in FIG. 1F, the space 112 includes controllable partitions (CP's) 188a and 188b. The CP's 188a, 188b are described in greater detail in commonly assigned and co-pending U.S. application Ser. No. 10/303,761, filed on Nov. 26, 2002, the disclosure of which is hereby incorporated by reference in its entirety. As described in that patent application, the CP's 188a, 188b are configured to control cooling fluid movement between the various zones in the space 112. In one regard, the CP's 188a, 188b generally operate to vary the pressure of the cooling fluid contained in the various zones. Thus, for instance, if the pressure in one zone is higher than desired, the CP associated with that zone may be manipulated to thereby vary the pressure of that zone.

As also illustrated in FIG. 1F, LAS's 120k, 120l are positioned in the various zones of the space 112. The LAS's 120k, 120l may be located in the respective vicinities of the CP's 188a, 188b or the LAS's 120k, 120l may be formed as parts of the CP's 188a, 188b. The LAS's 120k, 120l may be designed to detect one or more environmental conditions in the vicinities of the CP's 120k, 120l or their associated zones. For instance, the LAS's 120k, 120l may be configured to detect the pressure in the respective zones of the CP's 188a, 188b. In one example, the detected conditions may be wirelessly transmitted to a controller of the CP's 188a, 188b, which may operate to manipulate the CP's 188a, 188b to vary the pressure of the cooling fluid contained in their associated zones. In another example, the detected conditions may be wirelessly transmitted to other LAS's, e.g., LAS's 120a–120j, or to another device configured to control the CP's 188a, 188b. For instance, the detected conditions may be transmitted to the computer system 122 or the robotic device 130 which may employ the detected condition information in manipulating one or more cooling system components including the CP's 188a, 188b.

Figure 2A:
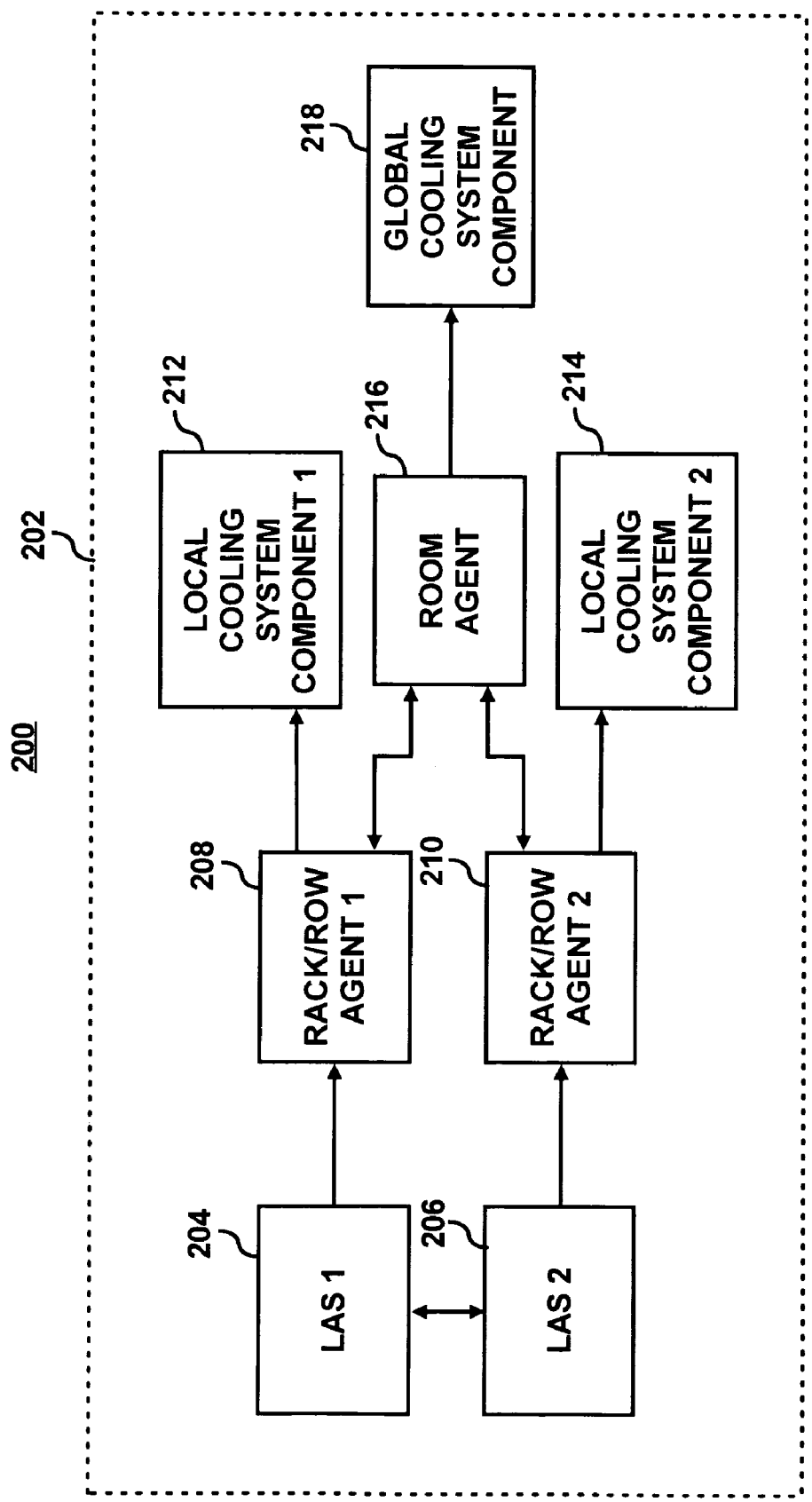
FIG. 2A is an exemplary block diagram for a cooling arrangement that utilizes LAS's, according to an embodiment of the invention.

FIG. 2A is an exemplary block diagram 200 for a cooling arrangement 202 that utilizes LAS's 204 and 206 according to an embodiment of the invention. It should be understood that the following description of the block diagram 200 is but one manner of a variety of different manners in which such a cooling arrangement 202 may be configured. In addition, it should be understood that the block diagram 200 may include additional components and that some of the components described herein may be removed and/or modified without departing from the scope of the invention. For instance, the block diagram 200 may include any number of LAS's 204, 206 arranged in any suitable configuration without departing from the scope of the invention. It should thus be appreciated that the block diagram 200 configuration may be varied according to various design characteristics, such as, the layout of the room, the desired cooling performance, etc.

The cooling arrangement 202 includes a plurality of LAS's 204, 206. The LAS's 204, 206 may comprise any of the LAS's described hereinabove, for instance, LAS's 120a–120l. The LAS's 204, 206 may determine their locations with respect to each other as well as other locations in manners described in co-pending U.S. patent application Ser. No. 10/620,272. As also described in that application, the LAS's 204, 206 may also be configured to transmit and receive information from other LAS's. The information may pertain to, for instance, one or more conditions detected by sensors either associated with or integrated with the LAS's 204, 206. The LAS's 204, 206 may also be associated with one or more respective local cooling system components. The local cooling system components may include, for instance, the vent tiles 116, the returns 164, the VVD's 180a and 180b, the CP's 188a and 188b, etc. These components are considered local cooling system components because substantially localized conditions around these cooling system components may be controlled or varied by manipulation of these components.

By virtue of the association between the LAS's 204, 206 and their respective local cooling system components, the locations of the various local cooling system components may be determined through determination of the locations of the LAS's 204, 206. In this regard, for instance, the locations of the local cooling system components may be determined without requiring that personnel manually track their locations.

The LAS's 204, 206 may also be associated with a controller, for instance, one or more rack/row agents 208, 210. The association between the LAS's 204, 206 and the one or more rack/row agents 208, 210 may be based upon the locations of the LAS's 204, 206 and the one or more rack' row agents 208, 210. For instance, if the LAS 204 is located in the same row as the rack/row agent 208, the LAS 204 may be associated with the rack/row agent 208. As another example, if the LAS's 204, 206 are located in the same row as the rack/row agent 208, they may both be associated with the rack/row agent 208. As a further example, the LAS's 204, 206 may be associated with the rack/row agent 208, 210 configured to control the local cooling system component associated with the LAS's 204, 206 and may thus be located in separate rows. As a yet further example, the LAS's 204, 206 may be associated with one or more rack/row agents 208, 210. For purposes of illustration and simplicity of description, in FIG. 2A, the LAS 204 is illustrated as being associated with the rack/row agent 208 and the LAS 206 is illustrated as being associated with the rack/row agent 210. It should, however, be understood that other LAS and rack/row agent configurations may be implemented without departing from the scope of the invention.

The LAS's 204, 206 may be configured to communicate with their associated rack/row agents 208, 210. In one respect, the rack/row agents 208, 210 may also comprise LAS's (not shown) configured to communicate and self-locate with respect to the LAS's 204, 206. In this regard, the association between the LAS's 204, 206 and the rack/row agents 208, 210 may also be created in a substantially autonomous manner. In addition, the information collected by the LAS's 204, 206 may also be transmitted to the rack/row agents 208, 210 through wireless connectivity devices of the LAS's 204, 206.

As described hereinabove and in co-pending U.S. patent application Ser. No. 10/345,723 filed on Jan. 16, 2003, entitled "AGENT BASED CONTROL METHOD AND SYSTEM FOR ENERGY MANAGEMENT", the rack/row agents 208, 210 may be defined as elements or entities that perceive their environment through sensors, in this case, through the sensors of the LAS's, and act upon that environment through effectors either in a collaborative or autonomous manner to achieve pre-defined goals. The rack/row agents 208, 210 are denoted as rack/row agents because they may be assigned to one or more racks, one or more rows of racks, or any number of racks therebetween. In addition, or alternatively, the rack/row agents 208, 210 may be assigned in various other manners without departing from the scope of the invention, for instance, the rack/row agents 208–210 may be assigned to various zones or locations in the room 100, or a single agent 208 or 210 may be assigned to the entire room 100.

The rack/row agents 208, 210 may employ the information received from the LAS's 204, 206 in determining whether to manipulate associated local cooling system components 212 and 214. For instance, if a pre-defined goal of the rack/row agents 208, 210 is to maintain the temperature around an associated rack or row of racks below a predetermined set point temperature, the rack/row agents 208, 210 may manipulate an associated local cooling system component 212, 214, for instance, a vent tile 116, a return 164 and 166, etc., in manners to substantially maintain temperatures around associated racks or rows below the predetermined set point temperature. Thus, for example, the rack/row agents 208, 210 may manipulate one or more of the local cooling system components 212, 214 to vary the cooling fluid flow therethrough. Although not specifically illustrated in FIG. 2A, the rack/row agents 208, 210 may be associated with a plurality of local cooling system components without departing from the scope of the invention. Thus, for instance, a rack/row agent 208, 210 may be associated with multiple vent tiles 116, multiple VVD's, etc., or combinations thereof.

As another example, if the LAS's 204, 206 comprise the LAS's 120i and 120j illustrated in FIG. 1E, the rack/row agents 208, 210 may control the VVD's 180a and 180b to vary cooling fluid flow therethrough. In this example, the local cooling system components 212, 214 generally comprise the VVD's 180a and 180b. In addition, the rack/row agents 208, 210 may control the VVD's 180a and 180b to vary the cooling fluid flow therethrough in manners as described in the Ser. No. 10/375,003 application, the disclosure of which is hereby incorporated by reference in its entirety.

As a yet further example, if the LAS's 204, 206 comprise the LAS's 120k and 120l illustrated in FIG. 1F, the rack/row agents 208, 210 may control the CP's 188a and 188b to vary the pressure of the cooling fluid contained in the various zones of the space 112. In this example, the local cooling system components 212, 214 generally comprise the CP's 188a and 188b. Moreover, the rack/row agents 208, 210 may control the CP's 188a and 188b in manners consistent with those described in the Ser. No. 10/303,761 application, the disclosure of which is hereby incorporated by reference in its entirety.

The rack/row agents 208, 210 may be configured to communicate with a room agent 216. The room agent 216 may also be defined as an element or entity that perceives its environment through sensors, in this case, through the sensors of the LAS's as communicated by the rack/row agents 208, 210, and act upon that environment through effectors either in a collaborative or autonomous manner to achieve pre-defined goals. The communications between the rack/row agents 208, 210 and the room agent 216 may be enabled via a wired protocol, such as IEEE 802.3, etc., wireless protocols, such as IEEE 801.11b, wireless serial connection, Bluetooth, etc., or combinations thereof. In addition, or alternatively, the rack/row agents 208, 210 and the room agent 216 may include or be associated with LAS's through which information may be transferred between the rack/row agents 208, 210 and the room agent 216.

The communications between the rack/row agents 208, 210 and the room agent 216 may be unidirectional, that is, from the rack/row agents 208, 210 to the room agent 216. Under this configuration, for instance, the rack/row agents 208, 210 may operate in relatively autonomous manners. More particularly, the rack/row agents 208, 210 may relatively autonomously make determinations on how to manipulate the local cooling system components 212, 214 without regard, for instance, to how other local cooling system components 212, 214 are manipulated. Alternatively, a bi-directional communication configuration may be provided between the rack/row agents 208, 210 and the room agent 216. Under this configuration, for instance, the rack/row agents 208, 210 may obtain instructions from the room agent 216 relating to the control of the local cooling system components 212, 214. The instructions from the room agent 216 may be based for instance on the principles described in either the Ser. No. 10/345,723 application filed on Jan. 16, 2003, entitled "AGENT BASED CONTROL METHOD AND SYSTEM FOR ENERGY MANAGEMENT", and the Ser. No. 10/697,692 application, the disclosures of which are hereby incorporated by reference in their entireties.

Under the bi-directional communication configuration, the room agent 216 may be configured to compile information received from a number of rack/row agents 208, 210 and make determinations on how to manipulate the local cooling system components 212, 214 based upon the received information. Thus, for instance, the room agent 216 may be configured to make local cooling system component 212, 214 manipulation decisions based upon various considerations that may be unavailable to the rack/row agents 208, 210. For instance, the room agent 216 may be capable of determining heated cooling fluid circulation in the room 100 and may base its decisions on minimizing adverse effects of recirculating the heated cooling fluid. Thus, for instance, the room agent 216 may determine that it may be best to decrease cooling fluid flow to an area of the room 100 having temperatures that exceed a predetermined maximum temperature to reduce recirculation of heated cooling fluid which may be the cause of the high temperature.

The room agent 216 may also be configured to control a global cooling system component 218. The global cooling system component 218 may comprise the CRAC unit 114. It is to be understood that the term "global" generally denotes a relatively large area of the room 100 and may denote an area smaller than the entire area of the room 100. In this regard, the global cooling system component 218 may be configured to supply cooling fluid to a particular area of the room 100. In addition, the room 100 may include any number of global cooling system components 218 each configured to supply cooling fluid to particular areas of the room 100.

The room agent 216 may control the global cooling system component 218 to vary one or more characteristics of cooling fluid supply to the room 100. The one or more characteristics may include the temperature of the cooling fluid supplied as well as the volume of cooling fluid supplied. In this regard, the room agent 218 may be configured to control one or both of the fan and the cooling fluid cooling device, for instance, the compressor, chiller, or other heat exchanger, of the global cooling system component 218.

The decisions on how to manipulate the global cooling system component 218 may be based upon the information received from the rack/row agents 208, 210. For instance, the room agent 216 may include a memory having a look up table containing control options for information received from the rack/row agents 208, 210. In addition, or alternatively, the room agent 216 may perform calculations based upon cooling scheme algorithms to determine the control options. The room agent 216 may, for instance, determine that the temperature of the cooling fluid requires adjustment if there are a relatively large number of areas in the room 100 that exceed a certain predetermined temperature, for instance, around 10–90% of the room 100 exceeds around 25–35° C. As another example, the room agent 216 may determine that the volume flow rate of the cooling fluid supplied into the space 112 requires adjustment if the certain predetermined temperature is exceeded. As a further example, the room agent 216 may determine that global cooling system component 218 requires adjustment based on the amount of change in the cooling fluid flow through the various local cooling system components 212, 214. By way of example, if the total volume flow rate of the cooling fluid flow through the local cooling system components 212, 214 exceeds or falls below a predetermined value, the room agent 216 may decide to increase the volume flow rate of cooling fluid supplied by the global cooling system component 218. Alternatively, the room agent 216 may determine that no changes in the global cooling system component 218 are necessary. This may occur, for instance, if the total increase in cooling fluid flow through the local cooling system components 212, 214 substantially equals the total decrease in cooling fluid flow through the local cooling system components 212, 214.

The global cooling system component 218 may also include or otherwise be associated with a LAS (not shown). The LAS of the global cooling system component 218 may be positioned or configured to detect, for instance, characteristics of the cooling fluid supplied by the global cooling system component 218. The LAS may also be configured to detect characteristics of heated cooling fluid supplied to the global cooling system component 218. The detected information may be supplied to the room agent 216. The room agent 216 may employ the detected information in controlling the global cooling system component 218. For instance, if a LAS detects that the temperature of the cooling fluid supplied from the global cooling system component 218 is too high, for instance, above around 20–30° C., the room agent 216 may control the global cooling system component 218 to reduce the temperature of the cooling fluid. As another example, if the volume flow rate of the supplied cooling fluid is below an acceptable threshold, the room agent 216 may control the global cooling system component 218 to increase the volume flow rate of the cooling fluid supplied into the space 112.

Although specific examples have been provided with respect to the operabilities of the components contained in the cooling arrangement 202, embodiments of the invention are not to be held within the confines of those examples. Instead, it should be appreciated that the components of the cooling arrangement 202 may be operated in other manners without departing from the scope of the invention.

Figure 2B:
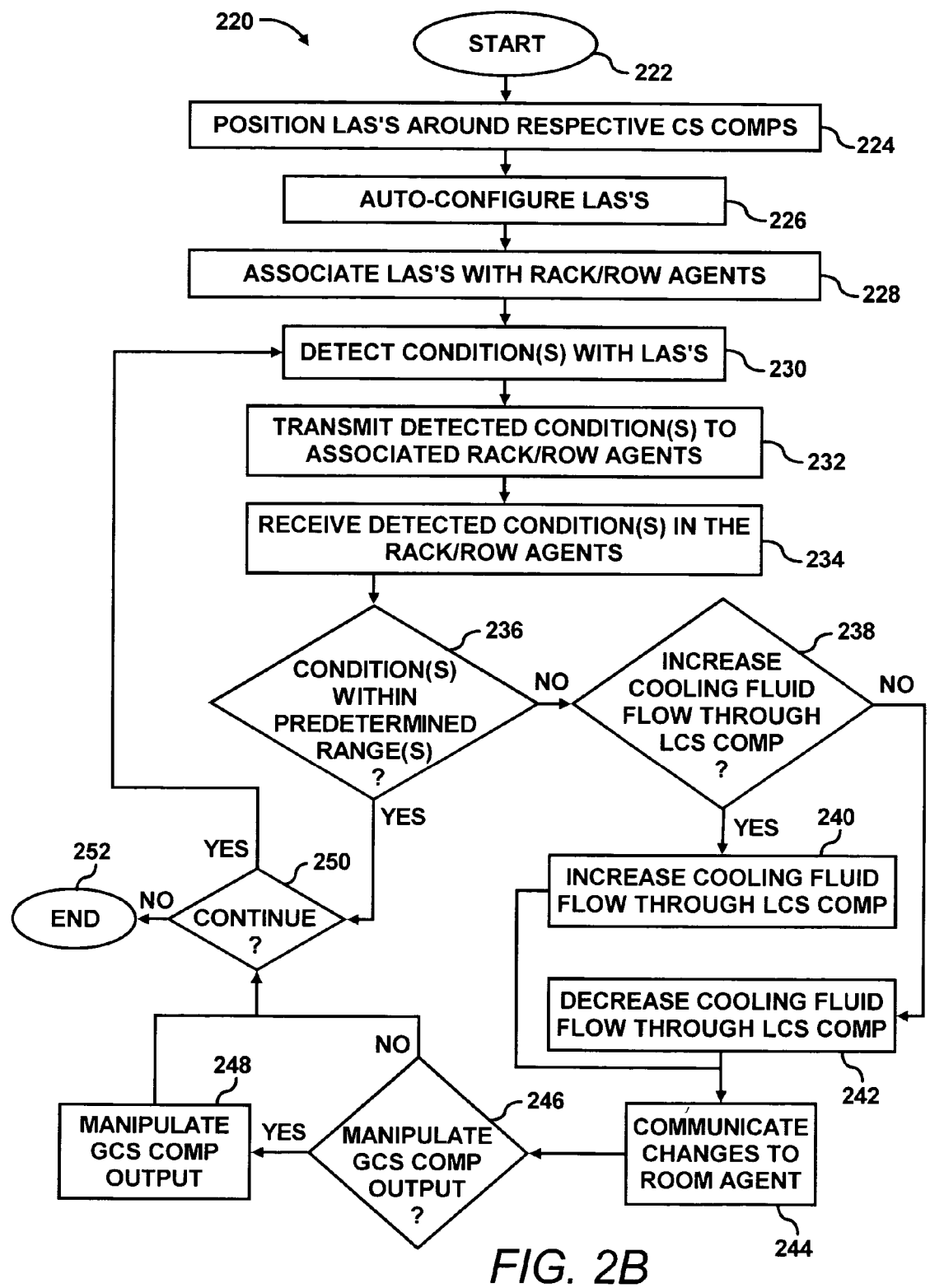
FIG. 2B illustrates an exemplary flow diagram of an operational mode of a method for operating a cooling arrangement according to an embodiment of the invention.

FIG. 2B illustrates an exemplary flow diagram of an operational mode 220 of a method for operating a cooling arrangement 202 according to an embodiment of the invention. It is to be understood that the following description of the operational mode 220 is but one manner of a variety of different manners in which an embodiment of the invention may be practiced. It should also be apparent to those of ordinary skill in the art that the operational mode 220 represents a generalized illustration and that other steps may be added or existing steps may be removed, modified or rearranged without departing from the scope of the invention.

The description of the operational mode 220 is made with reference to the block diagram 200 illustrated in FIG. 2A, and thus makes reference to the elements cited therein. It should, however, be understood that the operational mode 220 is not limited to the elements set forth in the block diagram 200. Instead, it should be understood that the operational mode 220 may be practiced by a cooling arrangement having a different configuration than that set forth in the block diagram 200.

The operational mode 220 may be initiated in response to a variety of stimuli at step 222. For example, the operational mode 220 may be initiated in response to a predetermined lapse of time, in response to receipt of a transmitted signal, manually initiated, etc. In addition, steps 224–228 may be performed prior to initiation of the operational mode 220. At step 224, the LAS's 204 and 206 may be positioned around respective cooling system components, for instance, the local cooling system components 212 and 214 and the global cooling system component 218. In addition, the LAS's 204 and 206 may be associated with respective ones of the local cooling system components 212 and 214 and/or the global cooling system component 218. Alternatively, the LAS's 204 and 206 may be integrally formed with respective local and global cooling system components 212, 214 and 218. In this regard, the LAS's 204 and 206 may be positioned in the room 100 as the various local and global cooling system components 212, 214, and 218 are positioned in the room 100.

At step 226, the LAS's 204 and 206 may be auto-configured. In other words, the locations of the LAS's 204 and 206 may be determined through the self-locating features of the LAS's 204 and 206. As stated hereinabove, the LAS's 204 and 206 may be configured to determine their locations with respect to each other and to other reference locations. In this regard, the locations of the LAS's 204 and 206 as well as the locations of the local and/or global cooling system components 212, 214, and 218 to which they are associated may be determined and tracked. By way of example, the locations of the local and/or global cooling system components 212, 214, and 218 may be stored in a memory of, for instance, the computer system 122, to inventory the cooling system components contained in the room 100.

At step 228, the LAS's 204 and 206 may be associated with respective rack/row agents 208, 210. As described hereinabove with respect to FIG. 2A, the association between the LAS's 204, 206 and the rack/row agents 208, 210 may substantially be based upon the locations of the LAS's 204, 206 and the rack/row agents 208, 210. For instance, the LAS's 204, 206 located in a particular row of racks may be associated with a rack/row agent 208, 210 assigned to that particular row of racks. As another example, the LAS's 204, 206 may be associated with a rack/row agent 208, 210 assigned to a particular zone in which the LAS's 204, 206 are located.

At step 230, the LAS's 204, 206 may be configured to detect one or more conditions in respective vicinities of the LAS's 204, 206. As described in greater detail hereinabove, the one or more conditions may comprise temperature, pressure, humidity, airflow velocity and/or direction, etc. The LAS's 204, 206 may be configured to detect the one or more conditions at predetermined intervals, for instance, every couple of minutes, or in a relatively continuous manner.

The LAS's 204, 206 may transmit the detected condition information to their respective associated rack/row agent 208, 210 at step 232. At step 234, the rack/row agents 208, 210 may receive the detected condition information from their associated LAS's 204, 206. The rack/row agents 208, 210 may process the detected condition information to determine whether one or more of the local cooling system components 212, 214 require manipulation. In the example illustrated in FIG. 2B, the determination of whether to manipulate one or more of the local cooling system components 212, 214 may be based upon the detected conditions exceeding predetermined ranges. It should, however, be understood that the manipulation determinations may be based upon other factors. For instance, the rack/row agents 208, 210 may base its decisions to manipulate the associated local cooling system components 212, 214 on pre-defined goals, for example, energy considerations, re-circulation issues, etc., as described in the co-pending Ser. No. 10/345,723 application, filed on Jan. 16, 2003, entitled "AGENT BASED CONTROL METHOD AND SYSTEM FOR ENERGY MANAGEMENT", and the Ser. No. 10/697,692 application.

In keeping with the example illustrated in FIG. 2B, the rack/row agents 208, 210 may determine whether the detected condition(s) are within predetermined range(s) at step 236. Examples of manners in which the rack/row agents 208, 210 may determine whether the detected condition(s) are within predetermined range(s) are provided hereinabove with respect to FIG. 2A. If the detected condition(s) are outside of the predetermined range(s), the rack/row agents 208, 210 may determine whether to increase cooling fluid flow through an associated local cooling system component 204, 206 (LCS Comp) at step 238.

The determination of whether to increase cooling fluid flow through an associated local cooling system component 204, 206 may be based upon whether the detected condition(s) exceeds the predetermined range(s). In one implementation, if the detected condition(s) exceeds the predetermined range(s), the rack/row agent 208, 210 may increase the cooling fluid flow through an associated local cooling system component 204 or 206, as indicated at step 240. In this implementation, the rack/row agent 208, 210 may also decrease the cooling fluid flow through an associated local cooling system component 204 or 206 if the detected condition(s) falls below the predetermined range(s), as indicated at step 242. By way of example, if the detected condition is temperature, the rack/row agent 208, 210 may increase the cooling fluid flow through an associated vent tile 116 and/or the heated cooling fluid flow through an associated return 164 and 166, in response to the detected temperature exceeding a predetermined temperature range. In addition, the rack/row agent 208, 210 may decrease the cooling fluid flow through an associated vent tile 116 or the heated cooling fluid flow through an associated return 164 and 166 in response to the detected temperature falling below a predetermined temperature range.

In another implementation, the rack/row agents 208, 210 may decrease the cooling fluid flow through an associated local cooling system component 204 or 206 as indicated at step 242 in response to the detected condition(s) falling below the predetermined range(s). In this implementation, the rack/row agents 208, 210 may factor in the possibility that increased cooling fluid supply or increase heated cooling fluid removal may actually cause an increase in the detected condition(s) due to, for instance, re-circulation of heated cooling fluid in the room 100. Therefore, in keeping with the example above, the rack/row agents 208, 210 may decrease the cooling fluid flow through an associated vent tile 116 and/or the heated cooling fluid removal through an associated return 164, 166 in response to the detected temperature exceeding a predetermined temperature range. In addition, the rack/row agents 208, 210 may increase the cooling fluid supply through an associated vent tile 116 and/or the heated cooling fluid removal through an associated return 164, 166 in response to the detected temperature falling below a predetermined temperature range.

In another example, the detected condition(s) may comprise pressure. In this example, at step 236, the rack/row agents 208, 210 may comprise pre-defined goals to maintain the pressures in their associated areas within predetermined ranges. The rack/row agents 208, 210 may operate one or more associated local cooling system components 204, 206 in manners to attempt satisfying those pre-defined goals. For instance, the associated areas of the rack/row agents 208, 210 may comprise various sections of the space 112. The pressures in the various areas of the space 112 may vary according to operations of the local cooling system components 204, 206 associated with the various areas. By way of example, the pressures may be varied through varying of cooling fluid flow through vent tiles 116 and the VVD's 180a and 180b. As another example, the pressures between various zones in the space 112 may also be varied through manipulation of the CP's 188a and 188b.

The rack/row agents 208, 210 may operate associated local cooling system components 204, 206 to, for instance maintain substantially constant pressures throughout the space 112. In one regard, through maintaining of substantially constant pressures, the volume flow rate of cooling fluid supplied through the vent tiles 116 may also be held relatively constant. Through the relatively constant volume flow rate of cooling fluid, the cooling fluid supplied through the vent tiles 116 may be substantially controlled.

According to this implementation, at step 238, the rack/row agents 208, 210 may determine whether or not to increase cooling fluid flow through one or more of the associated local cooling system components 204, 206. The rack/row agents 208, 210 may determine that an increase in cooling fluid flow through an associated local cooling system component 204, 206 is necessary if the detected pressure is below a predetermined pressure range. The rack/row agents 208, 210 may implement the increase in cooling fluid flow as indicated at step 240. The rack/row agents 208, 210 may also determine that a decrease in cooling fluid flow through an associated local cooling system component 204, 206 is necessary if the detected pressure is above the predetermined pressure range. The rack/row agents 208, 210 may implement the decrease in cooling fluid flow as indicated at step 242.

Following either or both of steps 240 and 242, the rack/row agents 208, 210 may communicate changes to cooling fluid flow through their associated local cooling system components 204, 206 to the room agent 216 at step 244. The room agent 216 may determine whether to manipulate the global cooling system component 218 (GCS Comp), for instance, the CRAC unit 114 at step 246. The room agent 216 may decide to manipulate the global cooling system component 218 based upon the information received from the rack/row agents 208 and 210. For instance, the room agent 216 may decide to decrease the volume flow rate of cooling fluid supplied by the global cooling system component 218 in response to information from the rack/row agents 208, 210 indicating that cooling fluid flow through one or more of the local cooling system components 204, 206 exceeds a predetermined threshold. The predetermined threshold may be selected based upon various factors. These factors may include, for instance, the desired energy usage of the global cooling system component 218, the reliability of the components 118 contained in the room, service level agreements, etc. In addition, or alternatively, the room agent 216 may be configured to vary one or more characteristics of the output from the global cooling system component 218 in response any reasonably suitable discernable changes in the cooling fluid flow through the local cooling system components 204, 206.

In addition to basing decisions on whether to manipulate the global cooling system component 218 on information received from the rack/row agents 208, 210, the room agent 216 may also base its decisions on information received from one or more sensors associated with the room agent 216. For instance, the room agent 216 may also be associated with a LAS configured to detect one or more conditions and the room agent 216 may base its decisions on information received from that LAS.

In any respect, if the room agent 216 decides that the global cooling system component 218 requires manipulation, the room agent 216 may manipulate the global cooling system component 218 at step 248. As described hereinabove, the room agent 216 may be configured to manipulate the global cooling system 218 to vary one or both of the temperature of the cooling fluid and the volume flow rate of the cooling fluid supplied into the space 112.

As also described hereinabove, according to an alternative example, the room agent 216 may also determine manners in which the rack/row agents 208, 210 are to manipulate the local cooling system components 204, 206. In this example, the room agent 216 may make determinations of whether to increase cooling fluid flow through one or more local cooling system components at step 238. In addition, through implementation of this example, determinations of manners in which the local cooling system components 204, 206 are to be manipulated may be based upon more global concerns. That is, for instance, the room agent 216 may be capable of basing these decisions on their effects to larger portions of the room 100 or the entire room 100.

At step 250, it may be determined as to whether the operational mode 220 is to continue. The determination of whether to continue the operational mode 220 may be based, for instance, upon a predetermined time interval. More particularly, the operational mode 220 may be configured to continue for a predetermined time interval, e.g., a few minutes, hours, as long as the components 118 in the room 100 are operational, during certain times during a day, etc. The operational mode 220 may also be configured to follow an operating schedule. For instance, the operational mode 220 may be performed a pre-set number of times before it is ended, a pre-set number of times during day, etc. The determination of when and for how long the operational mode 220 is to be performed may be based upon, for instance, service level agreements, performance expectancies, etc.

If it is determined that the operational mode 220 is to end, for instance, a time period expires, the components in the room are powered down, the operational mode 220 is manually discontinued, etc., the operational mode 220 may end as indicated at step 252. If, however, the operational mode 220 is to be continued, steps 230–250 may be continued for so long as the operational mode 220 is programmed to be continued.

The operations set forth in the operational mode 220 may be contained as a utility, program, or subprogram, in any desired computer accessible medium. In addition, the operational mode 220 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 3A:
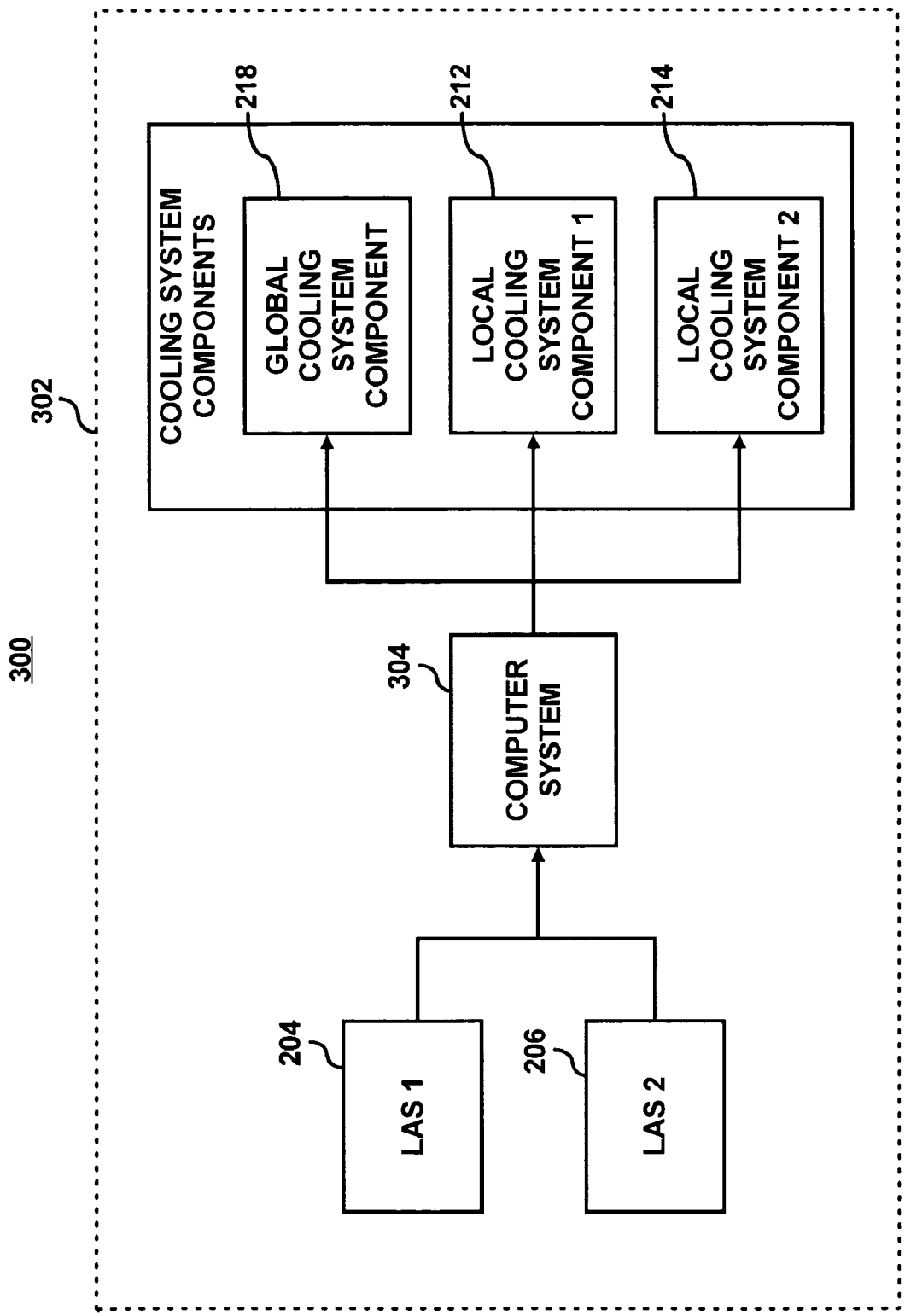
FIG. 3A is an exemplary block diagram for a cooling arrangement that utilizes the LAS's, according to an embodiment of the invention.

FIG. 3A is an exemplary block diagram 300 for a cooling arrangement 302 that utilizes the LAS's 204 and 206, according to an embodiment of the invention. It should be understood that the following description of the block diagram 300 is but one manner of a variety of different manners in which such a cooling arrangement 302 may be configured. In addition, it should be understood that the block diagram 300 may include additional components and that some of the components described herein may be removed and/or modified without departing from the scope of the invention. For instance, the block diagram 300 may include any number of LAS's 204, 206 arranged in any suitable configuration without departing from the scope of the invention. It should thus be appreciated that the block diagram 300 configuration may be varied according to various design characteristics, such as, the layout of the room, the desired cooling performance, etc.

The cooling arrangement 302 includes the LAS's 204 and 206 disclosed and described hereinabove with respect to the cooling arrangement 202 depicted in FIG. 2A. Accordingly, a detailed discussion of the LAS's 204, 206 are omitted for purposes of brevity. As can be seen in comparing the cooling arrangement 302 and the cooling arrangement 202, the cooling arrangement 302 of FIG. 3A includes a computer system 304 as a controller in place of the rack/row agents 208, 210 and the room agent 210. The computer system 304 generally comprises the computer system 122 illustrated in FIGS. 1A and 1B and is configured to control various cooling system components based upon input received from the LAS's 204, 206. Alternatively, the computer system 304 may comprise a mobile computing platform, for instance, a laptop computer, supported on the robotic device 130. The cooling system components generally comprise the local cooling system components 212, 214 and the global cooling system component 218.

The computer system 304 operates in manners similar to those described hereinabove with respect to the rack/row agents 208, 210 and the room agent 216. That is, the computer system 304 receives information from the LAS's 204, 206, determines whether and how to manipulate the cooling system components 212, 214 and 218, and controls the cooling system components 212, 214, and 218 based upon these determinations. The control decisions made by the computer system 304 may be similar to those described hereinabove with respect to FIG. 2A. In contrast to the rack/row agents 208, 210 and the room agent 216, however, the computer system 304 is a substantially centralized control device that may base control decisions on a larger scale. For instance, the computer system 304 may operate in manners as set forth in the co-pending Ser. No. 10/620,272 application.

Figure 3B:
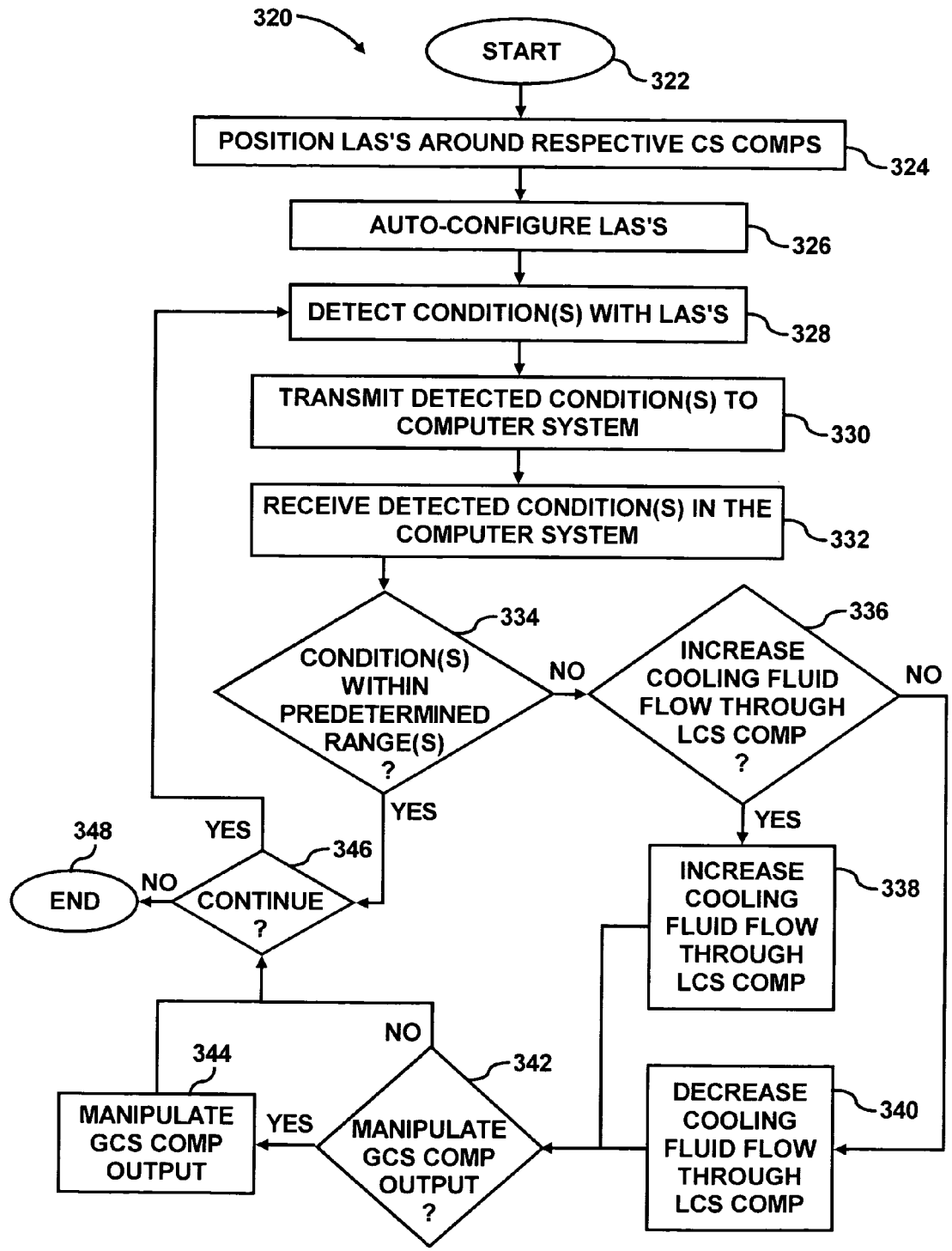
FIG. 3B illustrates an exemplary flow diagram of an operational mode of a method for operating a cooling arrangement according to an embodiment of the invention.

FIG. 3B illustrates an exemplary flow diagram of an operational mode 320 of a method for operating a cooling arrangement 302 according to an embodiment of the invention. It is to be understood that the following description of the operational mode 320 is but one manner of a variety of different manners in which an embodiment of the invention may be practiced. It should also be apparent to those of ordinary skill in the art that the operational mode 320 represents a generalized illustration and that other steps may be added or existing steps may be removed, modified or rearranged without departing from the scope of the invention.

The description of the operational mode 320 is made with reference to the block diagram 300 illustrated in FIG. 3A, and thus makes reference to the elements cited therein. It should, however, be understood that the operational mode 320 is not limited to the elements set forth in the block diagram 300. Instead, it should be understood that the operational mode 320 may be practiced by a cooling arrangement having a different configuration than that set forth in the block diagram 300.

The operational mode 320 may be initiated in response to a variety of stimuli at step 322. For example, the operational mode 320 may be initiated in response to a predetermined lapse of time, in response to receipt of a transmitted signal, manually initiated, etc. In addition, steps 324 and 326 may be performed prior to initiation of the operational mode 320. At step 324, the LAS's 204, 206 may be positioned around respective cooling system components, for instance, the local cooling system components 212, 214 and the global cooling system component 218. Alternatively, the LAS's 204, 206 may be integrally formed with respective local and global cooling system components 212, 214 and 218. In this regard, the LAS's 204, 206 may be positioned in the room 100 as the various local and global cooling system components 212, 214, and 218 are positioned in the room 100.

At step 326, the LAS's 204, 206 may be auto-configured as described hereinabove with respect to step 226 in FIG. 2B. At step 328, the LAS's 204, 206 may be configured to detect one or more conditions in respective vicinities of the LAS's 204, 206. As described in greater detail hereinabove, the one or more conditions may comprise temperature, pressure, humidity, airflow velocity and/or direction, etc. The LAS's 204, 206 may be configured to detect the one or more conditions at predetermined intervals, for instance, every couple of minutes, or in a relatively continuous manner.

The LAS's 204, 206 may transmit the detected condition information to the computer system 304 at step 330. At step 332, the computer system 304 may receive the detected condition information from the LAS's 204, 206. The computer system 304 may process the detected condition information to determine whether one or more of the local cooling system components 212, 214 require manipulation. In the example illustrated in FIG. 3B, the determination of whether to manipulate one or more of the local cooling system components 212, 214 may be based upon the detected conditions exceeding predetermined ranges. It should, however, be understood that the manipulation determinations may be based upon other factors. For instance, the computer system 304 may base its decisions to manipulate one or more of the local cooling system components 212, 214 on pre-defined goals, for example, energy considerations, re-circulation issues, etc.

In keeping with the example illustrated in FIG. 3B, the computer system 304 may determine whether the detected condition(s) are within predetermined range(s) at step 334. Examples of manners in which the computer system 304 may determine whether the detected condition(s) are within predetermined range(s) are provided hereinabove. If the detected condition(s) are outside of the predetermined range(s), the computer system 304 may determine whether to increase cooling fluid flow through one or more of the local cooling system components 204, 206 (CS Comp) at step 336.

The determination of whether to increase cooling fluid flow through one or more of the local cooling system components 204, 206 may be based upon whether the detected condition(s) exceeds the predetermined range(s). In one implementation, if the detected condition(s) exceeds the predetermined range(s), the computer system 304 may increase the cooling fluid flow through one or more of the local cooling system components 204 or 206, as indicated at step 338. In this implementation, the computer system 304 may also decrease the cooling fluid flow through one or more local cooling system components 204 or 206 if the detected condition(s) falls below the predetermined range(s), as indicated at step 340. By way of example, if the detected condition is temperature, the computer system 304 may increase the cooling fluid flow through a vent tile 116 and/or the heated cooling fluid flow through a return 164 and 166, in response to the detected temperature exceeding a predetermined temperature range. In addition, the computer system 304 may decrease the cooling fluid flow through a vent tile 116 or the heated cooling fluid flow through a return 164, 166 in response to the detected temperature falling below a predetermined temperature range.

In another implementation, the computer system 304 may decrease the cooling fluid flow through one or more of the local cooling system components 204 or 206 as indicated at step 340 in response to the detected condition(s) falling below the predetermined range(s). In this implementation, the computer system 304 may factor in the possibility that increased cooling fluid supply or increase heated cooling fluid removal may actually cause an increase in the detected condition(s) due to, for instance, re-circulation of heated cooling fluid in the room 100. Therefore, in keeping with this example, the computer system 304 may decrease the cooling fluid flow through a vent tile 116 and/or the heated cooling fluid removal through a return 164, 166 in response to the detected temperature exceeding a predetermined temperature range. In addition, the computer system 304 may increase the cooling fluid supply through a vent tile 116 and/or the heated cooling fluid removal through a return 164, 166 in response to the detected temperature falling below a predetermined temperature range.

In another example, the detected condition(s) may comprise pressure. In this example, at step 334, the computer system 304 may comprise pre-defined goals to maintain the pressures in various areas within predetermined ranges. The computer system 304 may operate one or more local cooling system components 204, 206 in manners to attempt to satisfy those pre-defined goals. For instance, the various areas may comprise various sections of the space 112. The pressures in the various areas of the space 112 may vary according to operations of the local cooling system components 204, 206 associated with the various areas. By way of example, the pressures may be varied through varying of cooling fluid flow through vent tiles 116 and the VVD's 180a, 180b. As another example, the pressures between various zones in the space 112 may also be varied through manipulation of the CP's 188a, 188b.

The computer system 304 may operate one or more local cooling system components 204, 206 to, for instance, maintain substantially constant pressures throughout the space 112. In one regard, through maintaining of substantially constant pressures, the volume flow rate of cooling fluid supplied through the vent tiles 116 may also be held relatively constant. Through the relatively constant volume flow rate of cooling fluid, the cooling fluid supplied through the vent tiles 116 may be substantially controlled.

According to this implementation, at step 336, the computer system 304 may determine whether or not to increase cooling fluid flow through one or more of the local cooling system components 204, 206. The computer system 304 may determine that an increase in cooling fluid flow through one or more local cooling system components 204, 206 is necessary if the detected pressure is below a predetermined pressure range. The computer system 304 may implement the increase in cooling fluid flow as indicated at step 338. The computer system 304 may also determine that a decrease in cooling fluid flow through one or more local cooling system components 204, 206 is necessary if the detected pressure is above the predetermined pressure range. The computer system 304 may implement the decrease in cooling fluid flow as indicated at step 340.

Following either or both of steps 338 and 340, the computer system 304 may determine whether to manipulate the global cooling system component 218, for instance, the CRAC unit 114 at step 342. The computer system 304 may decide to manipulate the global cooling system component 218 based upon changes made through the one or more local cooling system components 212, 214. For instance, the computer system 304 may decide to decrease the volume flow rate of cooling fluid supplied by the global cooling system component 218 in response to cooling fluid flow through one or more of the local cooling system components 204 and 206 exceeding a predetermined threshold. The predetermined threshold may be selected based upon various factors. These factors may include, for instance, the desired energy usage of the global cooling system component 218, the reliability of the components 118 contained in the room, service level agreements, etc. In addition, or alternatively, the computer system 304 may be configured to vary one or more characteristics of the output from the global cooling system component 218 in response any reasonably suitable discernable changes in the cooling fluid flow through the local cooling system components 204, 206.

In any respect, if the computer system 304 decides that the global cooling system component 218 requires manipulation, the computer system 304 may manipulate the global cooling system component 218 as indicated at step 344. As described hereinabove, the global cooling system 218 may be manipulated to vary one or both of the temperature of the cooling fluid and the volume flow rate of the cooling fluid supplied into the space 112.

At step 346, it may be determined as to whether the operational mode 320 is to continue. The determination of whether to continue the operational mode 320 may be based, for instance, upon a predetermined time interval. More particularly, the operational mode 320 may be configured to continue for a predetermined time interval, e.g., a few minutes, hours, as long as the components 118 in the room 100 are operational, during certain times during a day, etc. The operational mode 320 may also be configured to follow an operating schedule. For instance, the operational mode 320 may be performed a pre-set number of times before it is ended, a pre-set number of times during day, etc. The determination of when and for how long the operational mode 320 is to be performed may be based upon, for instance, service level agreements, performance expectancies, etc.

If it is determined that the operational mode 320 is to end, for instance, a time period expires, the components in the room are powered down, the operational mode 320 is manually discontinued, etc., the operational mode 320 may end as indicated at step 348. If, however, the operational mode 320 is to be continued, steps 328–346 may be continued for so long as the operational mode 320 is programmed to be continued.

The operations set forth in the operational mode 320 may be contained as a utility, program, or subprogram, in any desired computer accessible medium. In addition, the operational mode 320 may be embodied by a computer program, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 4:
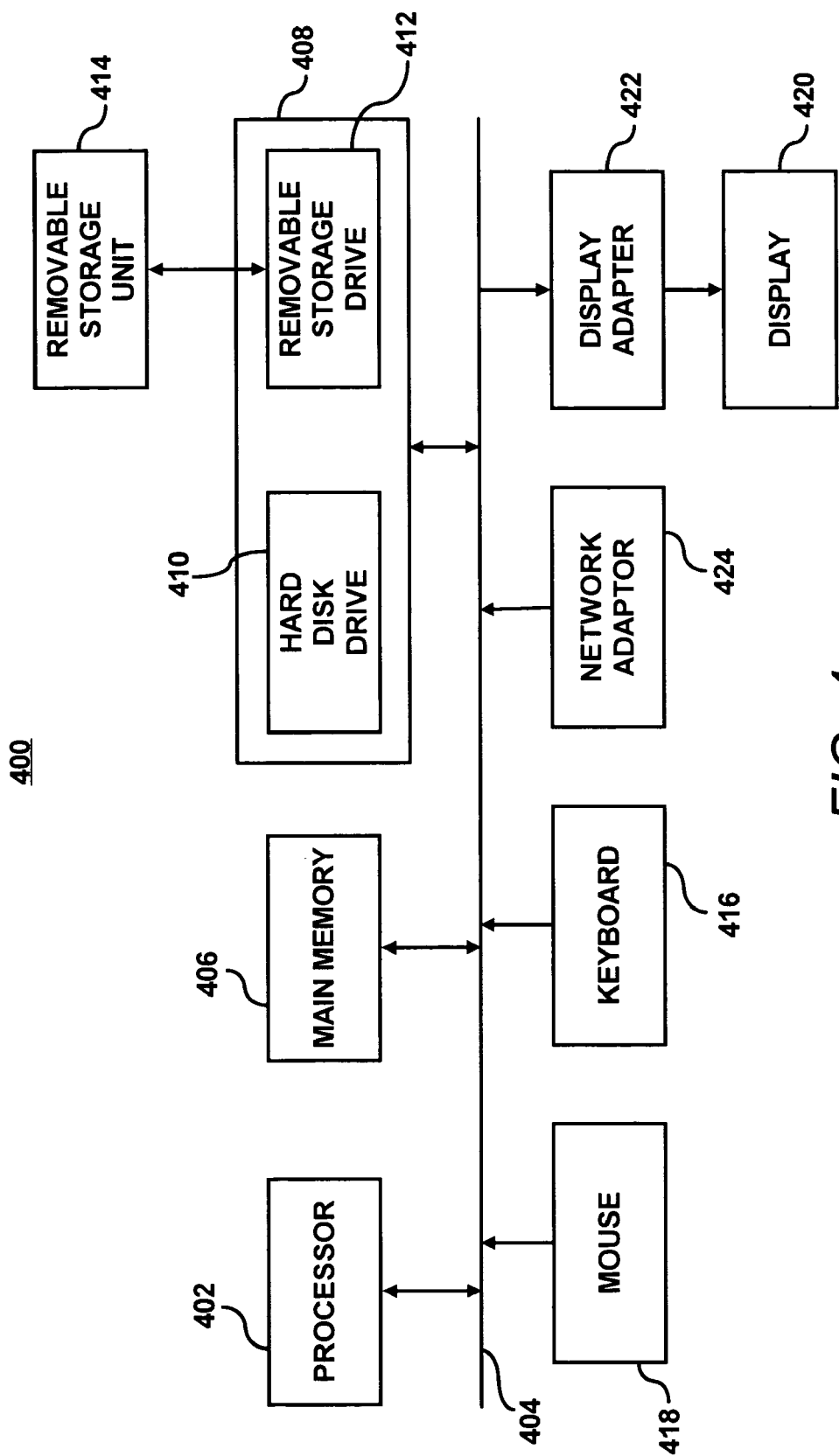
FIG. 4 illustrates an exemplary computer system 400, according to an embodiment of the invention.

FIG. 4 illustrates an exemplary computer system 400, according to an embodiment of the invention. The computer system 400 includes one or more controllers, such as a processor 402. The processor 402 may be used to execute some or all of the steps described in the operational mode 220 and 320. Commands and data from the processor 402 are communicated over a communication bus 404. The computer system 400 also includes a main memory 406, such as a random access memory (RAM), where the program code for, for instance, the rack/row agents 208 and 210, the room agent 216, and the computer system 304, may be executed during runtime, and a secondary memory 408. The secondary memory 408 includes, for example, one or more hard disk drives 410 and/or a removable storage drive 412, representing a floppy diskette drive, a magnetic tape drive, a compact disk drive, etc., where a copy of the program code for the cooling arrangements 200 and 300 may be stored.

The removable storage drive 410 reads from and/or writes to a removable storage unit 414 in a well-known manner. User input and output devices may include a keyboard 416, a mouse 418, and a display 420. A display adaptor 422 may interface with the communication bus 404 and the display 420 and may receive display data from the processor 402 and convert the display data into display commands for the display 420. In addition, the processor 402 may communicate over a network, e.g., the Internet, LAN, etc., through a network adaptor 424.

It will be apparent to one of ordinary skill in the art that other known electronic components may be added or substituted in the computer system 400. In addition, the computer system 400 may include a system board or blade used in a rack in a data center, a conventional "white box" server or computing device, etc. Also, one or more of the components in FIG. 4 may be optional (e.g., user input devices, secondary memory, etc.).

By virtue of certain embodiments of the invention, location aware sensors may be positioned at various locations in the room, and more particularly, at locations to detect one or more conditions around cooling system components. Through use of the LAS's, the costs associated with their deployment may be relatively lower as compared with the use of conventional sensors. The costs may be relatively lower, for instance, because the costs associated with deploying the LAS's as well as the amount of labor required to manually track the LAS locations may be substantially reduced over known methods of sensor deployment and implementation.

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method of controlling cooling fluid provisioning in a room housing a plurality of components, said room including at least one plenum having one or more cooling system components configured to vary a characteristic of at least one of cooling fluid supply to and removal from the room, said method comprising:

positioning location aware sensors at various locations in the room;

autonomously determining the locations of the location aware sensors with equipment contained in the location aware sensors;

detecting one or more conditions with the location aware sensors;

determining whether to manipulate at least one of the one or more cooling system components to modify a characteristic of cooling fluid contained in the plenum based upon the detected one or more conditions; and manipulating at least one of the one or more cooling system components in response to a determination that the at least of the one or more cooling system components is to be modified.

2. The method according to claim 1, wherein the step of determining the location of the location aware sensors comprises auto-configuring the location aware sensors.

3. The method according to claim 1, further comprising:
associating the location aware sensors with respective ones of the one or more cooling system components.

4. The method according to claim 3, wherein the one or more cooling system components comprise vent tiles configured to deliver cooling fluid from the plenum into various locations in the room and wherein the step of detecting one or more conditions comprises detecting one or more conditions of the cooling fluid delivered through the vent tiles.

5. The method according to claim 4, wherein the location aware sensors are attached to the vent tiles and wherein the step of detecting one or more conditions comprises detecting the one or more conditions with the location aware sensors attached to the vent tiles.

6. The method according to claim 4, wherein the step of determining whether to manipulate at least one of the one or more cooling system components comprises determining whether the detected one or more conditions are within one or more predetermined ranges and wherein the step of manipulating at least one of the one or more cooling system components comprises manipulating the vent tiles to vary cooling fluid flow through the vent tiles in response to the detected one or more conditions falling outside of the one or more predetermined ranges.

7. The method according to claim 3, wherein the one or more cooling system components comprise returns configured to remove cooling fluid from various locations in the room and wherein the step of detecting one or more conditions comprises detecting one or more conditions of the cooling fluid removed through the returns.

8. The method according to claim 7, wherein the step of determining whether to manipulate at least one of the one or more cooling system components comprises determining whether the detected one or more conditions are within one or more predetermined ranges and wherein the step of manipulating at least one of the one or more cooling system components comprises manipulating the returns to vary cooling fluid flow through the returns in response to the detected one or more conditions falling outside of the one or more predetermined ranges.

9. The method according to claim 3, wherein the one or more cooling system components comprise variable volume devices configured to supply cooling fluid from the plenum into various locations in the room and wherein the step of detecting one or more conditions comprises detecting one or more conditions of the cooling fluid in the plenum in the vicinities of the variable volume devices.

10. The method according to claim 9, wherein the step of determining whether to manipulate at least one of the one or more cooling system components comprises determining whether the detected one or more conditions are within one or more predetermined ranges and wherein the step of manipulating at least one of the one or more cooling system components comprises manipulating the variable volume devices to vary cooling fluid flow through the variable volume devices in response to the detected one or more conditions falling outside of the one or more predetermined ranges.

11. The method according to claim 3, wherein the one or more cooling system components comprise controllable partitions configured to control cooling fluid pressure in associated areas of the plenum and wherein the step of detecting one or more conditions comprises detecting one or more conditions of the cooling fluid in the associated areas of the controllable partitions.

12. The method according to claim 11, wherein the step of determining whether to manipulate at least one of the one or more cooling system components comprises determining whether the detected one or more conditions are within one or more predetermined ranges and wherein the step of manipulating at least one of the one or more cooling system components comprises manipulating the controllable partitions to vary a pressure of cooling fluid in respective associated areas in response to the detected one or more conditions falling outside of the one or more predetermined ranges.

13. The method according to claim 1, further comprising:
associating the location aware sensors with one or more agents; and
in the location aware sensors, transmitting the detected one or more conditions to an associated one of the one or more agents.

14. The method according to claim 13, wherein the one or more agents comprise rack or row agents and wherein the step of determining whether to manipulate at least one of the one or more cooling system components is performed by the rack or row agents.

15. The method according to claim 14, further comprising:
in the one or more agents, transmitting information pertaining to manipulation of the least one of the one or more cooling system components to a room agent.

16. The method according to claim 15, wherein the one or more cooling system components comprise a global cooling system component, said method further comprising:
in the room agent, determining whether to manipulate the global cooling system component; and
manipulating the global cooling system component in response to a determination to manipulate the global cooling system component.

17. The method according to claim 1, wherein the one or more agents comprise a room agent and wherein the step of determining whether to manipulate at least one of the one or more cooling system components is performed by the room agent.

18. The method according to claim 1, further comprising:
in the location aware sensors, transmitting the detected one or more conditions to a computer system configured to control the one or more cooling system components.

19. The method according to claim 18, further comprising:
in the computer system, determining whether to manipulate at least one of the one or more cooling system components; and
manipulating the at least one of the one or more cooling system components in response to a determination to manipulate the at least one of the one or more cooling system components.

20. The method according to claim 19, wherein the one or more cooling system components comprise at least one local cooling system component and a global cooling system component, said method further comprising:
in the computer system, determining manipulations of the at least one local cooling system component; and
manipulating the global cooling system component in response to the determination of the at least one cooling system component manipulations.

21. A system for controlling cooling fluid provisioning in a room housing a plurality of components, said room including at least one plenum having one or more cooling system components configured to vary a characteristic of at least one of cooling fluid supply to and removal from the room, said system comprising:
a plurality of location aware sensors positioned at various locations in the room, wherein the location aware sensors are positioned in respective vicinities of the one or more cooling system components, the location aware sensors being configured to determine their locations with respect to each other in a relatively autonomous manner;
a plurality of sensors configured to detect one or more conditions associated with the plurality of location aware sensors;
a controller configured to receive the detected one or more conditions from the plurality of sensors associated with the plurality of location aware sensors, said controller being configured to determine whether to manipulate at least one of the one or more cooling system components to modify a characteristic of cooling fluid contained in the plenum; and
wherein the controller is configured to manipulate at least one of the one or more cooling system components in response to a determination that the at least of the one or more cooling system components is to be modified.

22. The system according to claim 21, wherein the one or more cooling system components comprises at least one of a vent tile, a return, a variable volume device, a controllable partition, and an air conditioning unit.

23. The system according to claim 21, wherein the one or more cooling system components comprises at least one vent tile, and wherein the controller comprises an agent assigned to the at least one vent tile, and wherein the agent is configured to control the at least one vent tile.

24. The system according to claim 23, wherein the agent is configured for relocation with the relocation of the at least one vent tile.

25. The system according to claim 21, wherein the controller comprises at least one of a rack or row agent, a room agent, and a computer system.

26. The system according to claim 21, wherein the plurality of location aware sensors are configured to wirelessly communicate with each other and the controller.

27. The system according to claim 21, wherein the controller comprises a plurality of agents, said plurality of agents being associated with particular areas in the room, and wherein said plurality of agents are configured to control at least one cooling fluid characteristic in an associated area of the room.

28. The system according to claim 21, wherein said one or more conditions comprises at least one of temperature, humidity, pressure, air flow, and vibration.

29. A system for controlling cooling fluid provisioning with location aware sensors in a room housing a plurality of components, said room including at least one plenum having one or more cooling system components configured to vary a characteristic of at least one of cooling fluid supply to and removal from the room, said system comprising:

means for determining the locations of the location aware sensors, wherein the means for determining comprises equipment configured to enable the locations of the location aware sensors to be determined autonomously by the location aware sensors;
means for detecting one or more conditions with the location aware sensors;
means for determining whether to manipulate at least one of the one or more cooling system components to modify a characteristic of cooling fluid contained in the plenum; and
means for manipulating at least one of the one or more cooling system components in response to a determination that the at least of the one or more cooling system components is to be modified.

30. The system according to claim 29, wherein the means for determining the locations of the location aware sensors comprises means for auto-configuring the location aware sensors.

31. The system according to claim 29, wherein the one or more cooling system components comprises at least one of a vent tile, a return, a variable volume device, a controllable partition, and an air conditioning unit.

32. The system according to claim 29, wherein the one or more cooling system components comprises at least one vent tile, and wherein the location aware sensor comprises an agent assigned to the at least one vent tile, and wherein the agent is configured to control the at least one vent tile.

33. The system according to claim 32, wherein the agent is configured for relocation with the relocation of the at least one vent tile.

34. The system according to claim 29, further comprising:
means for controlling cooling fluid provisioning in respective various areas of the room; and
wherein the location aware sensors are in communication with the means for controlling cooling fluid provisioning.

35. The system according to claim 34, wherein the means for controlling cooling fluid provisioning comprises at least one of a rack or row agent, a room agent, and a computer system.

36. A computer readable storage medium on which is embedded one or more computer programs, said one or more computer programs implementing a method of controlling cooling fluid provisioning with location aware sensors in a room housing a plurality of components, said room including at least one plenum having one or more cooling system components configured to vary a characteristic of at least one of cooling fluid supply to and removal from the room, said one or more computer programs comprising a set of instructions for:
autonomously determining the locations of the location aware sensors with equipment contained in the location aware sensors;
detecting one or more conditions with the location aware sensors;
determining whether to manipulate at least one of the one or more cooling system components to modify a characteristic of cooling fluid contained in the plenum; and
manipulating at least one of the one or more cooling system components in response to a determination to that the at least of the one or more cooling system components is to be modified.

37. The computer readable storage medium according to claim 36, said one or more computer programs further comprising a set of instructions for:
auto-configuring the location aware sensors.

38. The computer readable storage medium according to claim 36, said one or more computer programs further comprising a set of instructions for:

associating the location aware sensors with one or more agents; and in the location aware sensors, transmitting the detected one or more conditions to an associated one of the one or more agents.

39. The computer readable storage medium according to claim 38, said one or more computer programs further comprising a set of instructions for:

in the one or more agents, manipulating at least one of the one or more cooling system components in response to the detected one or more conditions.

40. The computer readable storage medium according to claim 36, said one or more computer programs further comprising a set of instructions for:

in the location aware sensors, transmitting the detected one or more conditions to a computer system configured to control the one or more cooling system components.

41. The computer readable storage medium according to claim 40, said one or more computer programs further comprising a set of instructions for:

in the computer system, determining whether to manipulate at least one of the one or more cooling system components; and manipulating the at least one of the one or more cooling system components in response to a determination to manipulate the at least one of the one or more cooling system components.

42. The computer readable storage medium according to claim 41, wherein the one or more cooling system components comprise at least one local cooling system component and a global cooling system component, said one or more computer programs further comprising a set of instructions for:

in the computer system, determining manipulations of the at least one local cooling system component; and manipulating the global cooling system component in response to the determination of the at least one cooling system component manipulations.

* * * * *